(12) United States Patent
Schmaunz et al.

(10) Patent No.: US 12,283,456 B2
(45) Date of Patent: Apr. 22, 2025

(54) GAS RESERVOIR, GAS FEED DEVICE HAVING A GAS RESERVOIR, AND PARTICLE BEAM APPARATUS HAVING A GAS FEED DEVICE

(71) Applicant: Carl Zeiss Microscopy GmbH, Jena (DE)

(72) Inventors: Andreas Schmaunz, Oberkochen (DE); Gero Walter, Westhausen (DE); Bernd Stenke, Illertissen (DE); Gerald Schmid, Blaustein (DE)

(73) Assignee: Carl Zeiss Microscopy GmbH, Jena (DE)

( * ) Notice: Subject to any disclaimer, the term of this patent is extended or adjusted under 35 U.S.C. 154(b) by 366 days.

(21) Appl. No.: 18/079,074

(22) Filed: Dec. 12, 2022

(65) Prior Publication Data
US 2023/0282442 A1    Sep. 7, 2023

(30) Foreign Application Priority Data
Dec. 13, 2021    (DE) .......................... 102021132834.9

(51) Int. Cl.
*H01J 37/16* (2006.01)
*H01J 37/10* (2006.01)
*H01J 37/317* (2006.01)

(52) U.S. Cl.
CPC .............. *H01J 37/16* (2013.01); *H01J 37/10* (2013.01); *H01J 2237/006* (2013.01); *H01J 2237/0492* (2013.01); *H01J 2237/166* (2013.01)

(58) Field of Classification Search
CPC ...... H01J 37/16; H01J 37/10; H01J 2237/006; H01J 2237/0492; H01J 2237/166;
(Continued)

(56) References Cited

U.S. PATENT DOCUMENTS

| 2004/0036031 A1 | 2/2004 | Rose et al. |
| 2004/0173759 A1* | 9/2004 | Koops ................. H01J 37/3178 250/428 |

(Continued)

FOREIGN PATENT DOCUMENTS

| DE | 102 08 043 A1 | 9/2003 |
| DE | 10 2012 001 267 A1 | 7/2013 |

(Continued)

*Primary Examiner* — David E Smith
*Assistant Examiner* — Laura Eloise Tandy
(74) *Attorney, Agent, or Firm* — Muirhead and Saturnelli, LLC

(57) ABSTRACT

A gas reservoir that receives a precursor has a gas-receiving unit which is arranged in a first receiving unit of a basic body and a sliding unit which is arranged movably in a second receiving unit of the basic body. The gas-receiving unit has a movable closure unit for opening or closing a gas outlet opening of the gas-receiving unit. In a first position of the sliding unit, a first opening of a sliding-unit line device is fluidically connected to a first basic body opening and a second opening of the sliding-unit line device is fluidically connected to a second basic body opening. In the second position of the sliding unit, the first opening is arranged at an inner wall of the second receiving unit and the second opening is arranged at the movable closure unit.

20 Claims, 23 Drawing Sheets

(58) Field of Classification Search
CPC ............. H01J 37/3002; H01J 2237/317; H01J 37/244; H01J 37/317
See application file for complete search history.

(56) References Cited

U.S. PATENT DOCUMENTS

| | | |
|---|---|---|
| 2009/0223451 A1 | 9/2009 | Kruger et al. |
| 2011/0114665 A1 | 5/2011 | Chandler et al. |
| 2013/0187064 A1 | 7/2013 | Zeile et al. |
| 2015/0261085 A1 | 9/2015 | Chu |
| 2016/0118216 A1* | 4/2016 | Doemer ................. H01J 37/28 250/307 |
| 2016/0155607 A1* | 6/2016 | Rasmussen ............. B05B 1/005 239/11 |
| 2016/0260574 A1 | 9/2016 | Schmaunz et al. |
| 2017/0294285 A1 | 10/2017 | Huang et al. |
| 2018/0277361 A1 | 9/2018 | Routh et al. |

FOREIGN PATENT DOCUMENTS

| | | |
|---|---|---|
| DE | 10 2015 204 091 A1 | 9/2016 |
| EP | 1 363 164 A1 | 11/2003 |
| WO | WO 02/067286 A2 | 8/2002 |

* cited by examiner

GAS RESERVOIR, GAS FEED DEVICE HAVING A GAS RESERVOIR, AND PARTICLE BEAM APPARATUS HAVING A GAS FEED DEVICE

CROSS-REFERENCE TO RELATED APPLICATIONS

This application claims priority to the German patent application No. 10 2021 132 834.9, filed on 13 Dec. 2021, which is incorporated herein by reference.

TECHNICAL FIELD

The system described herein relates to a gas reservoir, to a gas feed device having a gas reservoir and to a particle beam apparatus having a gas feed device.

BACKGROUND

Electron beam apparatuses, in particular a scanning electron microscope (also referred to as SEM below) and/or a transmission electron microscope (also referred to as TEM below), are used to examine objects (samples) in order to obtain knowledge with respect to the properties and the behaviour under certain conditions.

In an SEM, an electron beam (also referred to as primary electron beam below) is generated using a beam generator and focused onto an object to be examined by way of a beam guiding system. The primary electron beam is guided in a raster manner over a surface of the object to be examined by way of a deflection device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An image representation of the object to be examined is thus obtained.

In the case of a TEM, a primary electron beam is likewise generated using a beam generator and focused on an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Imaging can also take place in the scanning mode of a TEM. Usually, such a TEM is referred to as STEM. Additionally, provision can be made for detecting electrons backscattered at the object to be examined and/or secondary electrons emitted by the object to be examined using a further detector in order to image an object to be examined.

Furthermore, it is known from the prior art to use combination apparatuses for examining objects, where both electrons and ions can be guided onto an object to be examined. By way of example, it is known to equip an SEM additionally with an ion beam column. An ion beam generator arranged in the ion beam column generates ions that are used for preparing an object (for example ablating material of the object or applying material to the object) or else for imaging. The SEM serves here in particular for observing the preparation, but also for further examination of the prepared or unprepared object.

In a further known particle beam apparatus, applying material to the object is carried out for example using the feed of a gas. The known particle beam apparatus is a combination apparatus that provides both an electron beam and an ion beam. The particle beam apparatus includes an electron beam column and an ion beam column. The electron beam column provides an electron beam that is focused onto an object. The object is arranged in a sample chamber kept under vacuum. The ion beam column provides an ion beam that is likewise focused on the object. By way of example, a layer of the surface of the object is removed using the ion beam. After the layer has been removed, a further surface of the object is exposed. Using a gas feed device, a gaseous state of a precursor substance—a so-called precursor—can be admitted into the sample chamber. In other words, the gaseous precursor substance is admitted into the sample chamber. It is known to embody the gas feed device with an acicular feed unit, which can be arranged very close to a position of the object at a distance of a few µm, such that the gaseous state of the precursor substance can be guided to this position as accurately as possible. As a result of the interaction of the ion beam with the gaseous state of the precursor substance, a layer of a substance is deposited on the surface of the object. By way of example, it is known for gaseous phenanthrene to be admitted as the gaseous state of the precursor substance into the sample chamber using the gas feed device. Essentially a layer of carbon or a carbon-containing layer then deposits on the surface of the object. It is also known to use a gaseous state of a precursor substance including metal in order to deposit a metal on the surface of the object. However, the depositions are not limited to carbon and/or metals. Rather, any desired substances can be deposited on the surface of the object, for example semiconductors, non-conductors or other compounds. Furthermore, it is known for the gaseous state of the precursor substance to be used for ablating material of the object upon interaction with a particle beam.

In order that the acicular feed unit does not disturb further processes for imaging, analysing and/or processing the object in the particle beam apparatus, it is known to move the acicular feed unit from a processing position into a parked position. In the processing position of the acicular feed unit, the gaseous state of the precursor substance is guided to the object. In the parked position, by contrast, no gaseous state of the precursor substance is guided to the object. The acicular feed unit is arranged in the parked position in such a way that the acicular feed unit does not influence further processes for imaging, analysing and/or processing the object using the particle beam apparatus. If it is again desired to feed the gaseous state of the precursor substance to the object, the acicular feed unit is moved into the processing position again. As soon as the acicular feed unit is in the processing position again, the gaseous state of the precursor substance is guided to the object.

As already mentioned above, a precursor serves, for example, for depositing material onto an object. Molecules of the gaseous state of the precursor are split using a particle beam, in particular using an electron beam or an ion beam. The resulting fragments are deposited on the surface of the object. It is known, by guiding the particle beam along a predeterminable pattern, to obtain depositions of the precursor on the surface of the object in accordance with the pattern. The number of fragments produced (i.e. basically the deposition rate of the precursor on the surface of the object) is firstly dependent on the current and the energy of the particles of the particle beam and secondly on the flow of the gaseous state of the precursor guided onto the surface of the object.

Furthermore, the deposition of the precursor on the surface of the object depends on the ratio of the current of the particle beam to the flow of the gaseous state of the precursor onto the surface of the object. This can be explained in simplified form as follows. If a particle of the particle beam strikes against a molecule of the gaseous state of the precursor, the particle of the particle beam splits the molecule. This produces fragments of the molecule of the gaseous state of the precursor that are deposited on the surface of the object. If the number of charged particles of the particle beam on the surface of the object is now increased by increasing the current of the particle beam, more molecules of the gaseous state of the precursor are split. This leads to an increase in the deposition rate. At a correspondingly high level of current of the particle beam, all of the molecules present in the gaseous state of the precursor are split. However, this means that, if the current of the particle beam increases further, an increase in the deposition rate can no longer be achieved. In order then to achieve an increase in the deposition rate, provision is made to increase the flow of the gaseous state of the precursor onto the surface of the object. To this extent, the deposition of the precursor is dependent on the ratio of the current of the particle beam to the flow of the gaseous state of the precursor onto the surface of the object.

When an ion beam is used to split the molecules of the gaseous state of the precursor, it is known that the ions of the ion beam also remove material from the surface of the object. If, accordingly, ions of the ion beam are used to split the molecules of the gaseous state of the precursor, a dynamic equilibrium therefore exists between depositions of fragments of the gaseous state of the precursor, on the one hand, and the removal of material of the object, on the other hand. If the flow of the gaseous state of the precursor to the surface of the object is not constant, an initial deposition may be removed again from the object and/or from the material of the object.

It is known to provide a precursor in the solid state (in other words: in solid form) or in the liquid state (in other words: in liquid form) in a precursor reservoir. The solid state or the liquid state of the precursor is in equilibrium with the gaseous state of the precursor. The individual atoms and molecules of the gaseous state of the precursor determine the vapour pressure of the precursor. If the precursor reservoir is opened by opening of a valve of the precursor reservoir, the gaseous state of the precursor is guided via lines to the acicular feed unit for the feed of the gaseous state of the precursor onto the surface of the object. The flow of the gaseous state of the precursor is determined by the vapour pressure of the precursor, with the vapour pressure depending on the temperature of the precursor. In order therefore to change the flow of the gaseous state of the precursor onto the surface of the object, it is known to change the temperature of the precursor reservoir and therefore the temperature of the precursor arranged in the precursor reservoir. Since the change in the temperature of the precursor reservoir may last for several minutes, it is difficult to obtain an immediate change in the flow of the gaseous state of the precursor onto the surface of the object. On the contrary, the desired flow of the gaseous state of the precursor onto the surface of the object is achieved only after a few minutes. Furthermore, it is known that the lines and the acicular feed unit should be heated so that the lines and the acicular feed unit are warmer than the precursor reservoir in order to prevent the precursor from condensing in the lines or in the acicular feed unit.

As mentioned above, the flow of the gaseous state of the precursor to the surface of the object can be started by opening of the valve of the precursor reservoir. If the valve is opened, the gaseous state of the precursor first flows through the lines which connect the precursor reservoir to the acicular feed unit, and the gaseous state of the precursor is then conducted using the acicular feed unit onto the surface of the object. Depending on the length of the lines, the flow of the gaseous state of the precursor to the surface of the object takes place with a delay in particular because of two effects, and therefore obtaining an immediate constant flow of the gaseous state of the precursor to the surface of the object is difficult. A first effect namely leads to a reduction in the flow of the gaseous state of the precursor to the surface of the object. Before the valve of the precursor reservoir is opened, the solid state or the liquid state of the precursor, on the one hand, and the gaseous state of the precursor, on the other hand, are in thermodynamic equilibrium. If the valve is opened, the thermodynamic equilibrium transfers into a dynamic equilibrium. This leads over time to a reduction in the flow of the gaseous state of the precursor to the surface of the object. A second effect leads to a reduction in the deposition rate. It is known that the precursor is subject to continuous thermal decomposition. If, during the decomposition of the precursor, fragments with a higher vapour pressure than the vapour pressure of the precursor arise, a temporally limited excessive flow of the gaseous state of the precursor to the surface of the object occurs when the valve of the precursor reservoir is opened. However, the increased flow does not lead to an increase in the deposition rate, but rather it has been shown that the deposition rate is generally reduced. Furthermore, because of the briefly increased vapour pressure, plasma discharges may occur when the valve is opened if the electron beam or the ion beam is guided to the object when the valve is opened. Such plasma discharges are undesirable. The increased vapour pressure may also lead to undesirable mechanical changes to the object.

By closing of the valve of the precursor reservoir, the flow of the gaseous state of the precursor to the surface of the object can be stopped. However, it is known that the flow of the gaseous state of the precursor to the surface of the object decreases only slowly because of the length and the cross sections of the lines.

Gas feed devices are known with which it is possible to guide a plurality of precursors separately from one another via a plurality of acicular feed units to the object, with in each case one acicular feed unit being used for the feed of in each case one precursor to the surface of the object. Owing to the plurality of acicular feed units and owing to a mechanism used for aligning the acicular feed units with respect to the surface of the object, the known gas feed devices require quite a large construction space. Furthermore, it is known that, when a plurality of acicular feed units are used, it is possible for the gaseous state of a first precursor from a first acicular feed unit to penetrate a second acicular feed unit for the feed of a gaseous state of a second precursor. This is undesirable since it may lead to chemical reactions, in particular to contaminations in the lines and in the acicular feed units.

Studies have found that a desired and/or constant inflow of a gaseous state of a precursor can be achieved in particular when the temperature of the precursor does not change or does not substantially change when the precursor reservoir is opened or closed.

With regard to the prior art, reference is made to DE 102 08 043 A1, US 2017/0294285 A1, DE 10 2012 001 267 A1, DE 10 2015 204 091 A1, US 2011/0114665 A1 and US 2009/0223451 A1.

SUMMARY OF THE INVENTION

The system described herein is therefore provides a gas reservoir, a gas feed device and a particle beam apparatus having the gas feed device, with which gas reservoir, gas feed device and particle beam apparatus the temperature of the precursor does not change or does not substantially change when the precursor reservoir is opened or closed.

The gas reservoir according to the system described herein has a basic body, the basic body being provided with a first receiving unit and with a second receiving unit. A gas-receiving unit is arranged in the first receiving unit of the basic body. For example, a precursor is arranged in the gas-receiving unit. The precursor is arranged, for example, in the solid state or in the liquid state in the gas-receiving unit. The solid state or the liquid state of the precursor is in equilibrium with the gaseous state of the precursor. The individual atoms and molecules of the gaseous state of the precursor determine the vapour pressure of the precursor. If the gas reservoir is opened by opening of a valve of the gas reservoir, the gaseous state of the precursor is let out of the gas reservoir.

Moreover, the gas-receiving unit has a gas outlet opening and a movable closure unit for opening or closing the gas outlet opening of the gas-receiving unit.

Furthermore, the gas reservoir according to the system described herein has a sliding unit which is arranged movably in the second receiving unit of the basic body. The sliding unit is provided with a sliding-unit line device, where the sliding-unit line device is designed to move the movable closure unit. The sliding-unit line device is provided with a first opening and a second opening. By contrast, the basic body has a first basic body opening and a second basic body opening, where the first basic body opening is connectable to a pump unit and where the second basic body opening is connectable to a line device for the feed of a gas (for example of a gaseous state of a precursor) to an object.

The sliding unit can be brought into a first position and into a second position. In the first position of the sliding unit, both the first opening of the sliding-unit line device is fluidically connected to the first basic body opening and the second opening of the sliding-unit line device is fluidically connected to the second basic body opening. It is therefore possible in the first position of the sliding unit to evacuate the line device for the supply of the gas to an object using the pump unit.

In the second position of the sliding unit, both the first opening of the sliding-unit line device is arranged at an inner wall of the second receiving unit and the second opening of the sliding-unit line device is arranged at the movable closure unit. In the case of the gas reservoir according to the system described herein, it is thus provided that the sliding unit is movable. The sliding unit is designed in such a manner that, on moving into the second position, the sliding unit interacts with the movable closure unit such that, first, because of the contact of the sliding-unit line device with the movable closure unit, the sliding unit seals the second opening of the sliding-unit line device, and that the first opening of the sliding-unit line device is arranged at the wall of the second receiving unit. Furthermore, the sliding unit interacts with the movable closure unit in such a manner that the movable closure unit opens up the gas outlet opening of the gas-receiving unit to ensure, on the one hand, that the gas (for example the gaseous state of the precursor) can flow out of the gas-receiving unit through the second basic body opening into the line device for the feed of the gas to the object. On the other hand, it has been shown that the thermals within the gas reservoir according to the system described herein are maintained and the temperature of the gas does not change or does not substantially change. If changes occur, the changes lie, for example, in the range of ±3° C. or of ±5° C. about a desired temperature. The fluctuations about a desired temperature do not or do not substantially affect the thermals within the gas reservoir according to the system described herein. The design of the gas reservoir therefore ensures that the temperature of the gas (in particular of a precursor) does not change or does not substantially change when the gas reservoir is opened or closed.

In an embodiment of the gas reservoir according to the system described herein, provision is additionally or alternatively made that, in the first position of the sliding unit, the first opening of the sliding-unit line device is arranged at the first basic body opening.

Furthermore, in a further embodiment of the gas reservoir according to the system described herein, provision is additionally or alternatively made that, in the first position of the sliding unit, the movable closure unit closes the gas outlet opening of the gas-receiving unit and that, in the second position of the sliding unit, the movable closure unit is arranged spaced apart from the gas outlet opening such that the gas outlet opening is open. In other words, upon moving of the sliding unit into the second position, the sliding unit interacts with the movable closure unit in such a manner that the movable closure unit is arranged spaced apart from the gas outlet opening such that the gas outlet opening is open.

In another further embodiment of the gas reservoir according to the system described herein, provision is additionally or alternatively made that the movable closure unit is pretensioned in the direction of the second receiving unit of the basic body. If the sliding unit is brought from the second position back into the first position again, in the embodiment of the system described herein, the movable closure unit is moved owing to the pretensioning in such a manner that the gas outlet opening of the gas-receiving unit is closed by the movable closure unit, and therefore gas can no longer emerge out of the gas outlet opening.

In an embodiment of the gas reservoir according to the system described herein, provision is additionally or alternatively made that the movable closure unit has a closure unit seal and that in the first position of the sliding unit, the closure unit seal of the movable closure unit is arranged sealingly on an inner wall of the gas-receiving unit. In other words, the movable closure unit sealingly closes the gas outlet opening when the sliding unit is in the first position. No gas can then pass out of the gas-receiving unit through the gas outlet opening.

In a further embodiment of the gas reservoir according to the system described herein, provision is additionally or alternatively made that the gas-receiving unit has a gas-receiving-unit seal on an outer side directed towards the first receiving unit of the basic body and that the gas-receiving-unit seal is sealingly arranged on an inner wall of the first receiving unit. The further embodiment is based on the idea that the gas-receiving unit of the gas reservoir is exchangeable. For example, the gas-receiving unit in inserted into the first receiving unit of the basic body such that the gas-receiving unit seal is sealingly arranged on the inner wall of the first receiving unit.

In another further embodiment of the gas reservoir according to the system described herein, provision is additionally or alternatively made that the sliding unit has a side, which is directed towards the movable closure unit, for operative connection to the movable closure unit and for moving the closure unit. The side of the sliding unit in turn has a sliding-unit seal, where the sliding-unit seal is arranged sealingly on the movable closure unit in the second position of the sliding unit.

In yet another embodiment of the gas reservoir according to the system described herein, provision is additionally or alternatively made that the sliding unit has at least one sealing device. Furthermore, the sliding unit has an outer side which is directed towards the inner wall of the second receiving unit. The sealing device is arranged on the outer side of the sliding unit for sealing connection to the inner wall of the second receiving unit.

In an embodiment of the gas reservoir according to the system described herein, provision is additionally or alternatively made that at least one heating device and/or at least one temperature-measuring device is/are arranged in the region of the sliding unit to ensure that the sliding unit, the first basic body opening and/or the second basic body opening can be somewhat warmer than the first receiving unit with the gas-receiving unit. For example, the sliding unit, the first basic body unit and/or the second basic body unit are/is approx. 1° C. to 3° C. warmer than the first receiving unit with the gas-receiving unit. The abovementioned embodiment avoids the gas condensing outside the gas-receiving unit (for example on the sliding unit and/or on the closure unit) when a gas-receiving unit is open.

In a further embodiment of the gas reservoir according to the system described herein, provision is additionally or alternatively made that the first receiving unit has a releasable closure device. The releasable closure device is operatively connected to the gas-receiving unit such that the gas-receiving unit is arranged on the inner wall of the first receiving unit. For example, the releasable closure device is screwable and/or insertable into the first receiving unit. The releasable closure device acts here on the gas-receiving unit in such a manner that the gas-receiving unit is pressed onto the inner wall of the first receiving unit such that the gas-receiving unit lies sealingly on the inner wall of the first receiving unit.

The system described herein also relates to a gas feed device having at least one first precursor reservoir which is configured as a gas reservoir for receiving a first precursor and which has at least one of the features mentioned herein or a combination of at least two of the features mentioned herein. Furthermore, the gas feed device according to the system described herein has at least one second precursor reservoir for receiving a second precursor.

The first precursor is arranged, for example, in the solid state or in the liquid state in the first precursor reservoir. The solid state or the liquid state of the first precursor is in equilibrium with the gaseous state of the first precursor. The individual atoms and molecules of the gaseous state of the first precursor determine the vapour pressure of the first precursor. If the first precursor reservoir is opened by opening of a valve of the first precursor reservoir, the gaseous state of the first precursor is let out of the first precursor reservoir.

The second precursor is arranged, for example, in the solid state or in the liquid state in the second precursor reservoir. The solid state or the liquid state of the second precursor is in equilibrium with the gaseous state of the second precursor. The individual atoms and molecules of the gaseous state of the second precursor determine the vapour pressure of the second precursor. If the second precursor reservoir is opened by opening of a valve of the second precursor reservoir, the gaseous state of the second precursor is let out of the second precursor reservoir.

As mentioned above, a precursor is a precursor substance which is used in the system described herein in order to deposit material on a surface of an object during interaction with a particle beam. For example, phenanthrene is used as the first precursor and/or the second precursor. Essentially a layer of carbon or a carbon-containing layer then deposits on the surface of the object. As an alternative thereto, by way of example, a precursor substance including metal can be used in order to deposit a metal on the surface of the object. However, the depositions are not limited to carbon and/or metals. Rather, any desired substances can be deposited on the surface of the object, for example semiconductors, non-conductors or other compounds. Furthermore, provision is also made, for example, for the gaseous state of the precursor to be used for ablating material of the object during interaction with the particle beam.

The gas feed device according to the system described herein has a feed unit for the feed of the gaseous state of the first precursor and/or the gaseous state of the second precursor onto the surface of the object. In particular, provision is made for the gas feed device according to the system described herein to have only a single feed unit for the feed of the gaseous state of the first precursor and/or of the gaseous state of the second precursor onto the surface of the object. The single feed unit therefore serves for the feed of the gaseous state of a plurality of precursors (for example the first precursor and the second precursor), where the feed of the gaseous state of the plurality of precursors preferably does not take place simultaneously, but rather the gaseous state of the individual precursors is fed temporally successively to the surface of the object. As an alternative thereto, provision is made for the gas feed unit according to the system described herein to have a plurality of feed units for the feed of the gaseous state of the first precursor and/or the gaseous state of the second precursor onto the surface of the object.

For example, the feed unit is embodied as a cannula and/or is acicular. Embodiments of the feed unit will be discussed in more detail further below.

Furthermore, the gas feed device according to the system described herein has at least one first line device for conducting the gaseous state of the first precursor to the feed unit, the first line device being arranged between the first precursor reservoir and the feed unit. Furthermore, the gas feed device according to the system described herein is provided with at least one second line device for conducting the gaseous state of the second precursor to the feed unit, the second line device being arranged between the second precursor reservoir and the feed unit.

The gas feed device according to the system described herein has at least one first valve for controlling the inflow of the gaseous state of the first precursor, the first valve being arranged between the first line device and the feed unit. Furthermore, the gas feed device according to the system described herein has at least one second valve for controlling the inflow of the gaseous state of the second precursor, the second valve being arranged between the second line device and the feed unit. At least one third valve for controlling the inflow of the gaseous state of the first precursor is arranged at the gas feed device according to the system described herein, the third valve being arranged between the first line device and the first precursor reservoir.

Furthermore, at least one fourth valve for controlling the inflow of the gaseous state of the second precursor is arranged at the gas feed device according to the system described herein, the fourth valve being arranged between the second line device and the second precursor reservoir.

The gas feed device according to the system described herein furthermore has at least one control valve for controlling the inflow of the gaseous state of the first precursor and/or the gaseous state of the second precursor to the feed unit. The control valve is connected to the first valve by a third line device. Furthermore, the control valve is connected to the second valve by a fourth line device. Moreover, the control valve is arranged between the first valve and the feed unit, on the one hand, and between the second valve and the feed unit, on the other hand. Furthermore, the control valve is connected to the feed unit for the feed of the gaseous state of the first precursor and/or the gaseous state of the second precursor. For example, the control valve is connected to the feed unit via a line. Additionally or as an alternative thereto, provision is made for the control valve to be part of the feed unit.

The gas feed device has all of the advantages which are explained herein.

In an embodiment of the gas feed device according to the system described herein, provision is additionally or alternatively made that the second precursor reservoir is configured as a gas reservoir which has at least one of the features mentioned herein or a combination of at least two of the features mentioned herein.

The system described herein furthermore relates to a particle beam apparatus for imaging, analysing and/or processing an object, including at least one beam generator for generating a particle beam with charged particles. By way of example, the charged particles are electrons or ions. The particle beam apparatus is provided with an optical axis, for example, along which the particle beam can be guided or is guided. Furthermore, the particle beam apparatus is provided with at least one objective lens for focusing the particle beam onto the object. Moreover, the particle beam apparatus according to the system described herein has a sample chamber for arranging the object in the particle beam apparatus. Furthermore, the particle beam apparatus according to the system described herein has at least one detector for detecting interaction particles and/or interaction radiation arising during an interaction of the particle beam with the object. The particle beam apparatus according to the system described herein additionally has at least one gas reservoir which has at least one of the features mentioned herein or a combination of at least two of the features mentioned herein. Furthermore, the particle beam apparatus according to the system described herein alternatively has at least one gas feed device which has at least one of the features mentioned herein or a combination of at least two of the features mentioned herein.

In a further embodiment of the particle beam apparatus according to the system described herein, provision is additionally or alternatively made for the beam generator to be embodied as a first beam generator, where the particle beam is embodied as a first particle beam with first charged particles, and where the objective lens is embodied as a first objective lens for focusing the first particle beam onto the object. Furthermore, the particle beam apparatus has at least one second beam generator for generating a second particle beam with second charged particles, and at least one second objective lens for focusing the second particle beam onto the object.

In yet another embodiment of the particle beam apparatus according to the system described herein, provision is made for the particle beam apparatus to be an electron beam apparatus and/or an ion beam apparatus.

BRIEF DESCRIPTION OF DRAWINGS

Further practical embodiments and advantages of the system described herein are described below in conjunction with the drawings, in which.

DETAILED DESCRIPTION OF VARIOUS EMBODIMENTS

The system described herein will now be explained in more detail using a particle beam apparatuses in the form of an SEM and in the form of a combination apparatus including an electron beam column and an ion beam column. Express reference is made to the fact that the invention can be used in any particle beam apparatus, in particular in any electron beam apparatus and/or any ion beam apparatus.

Figure 1:
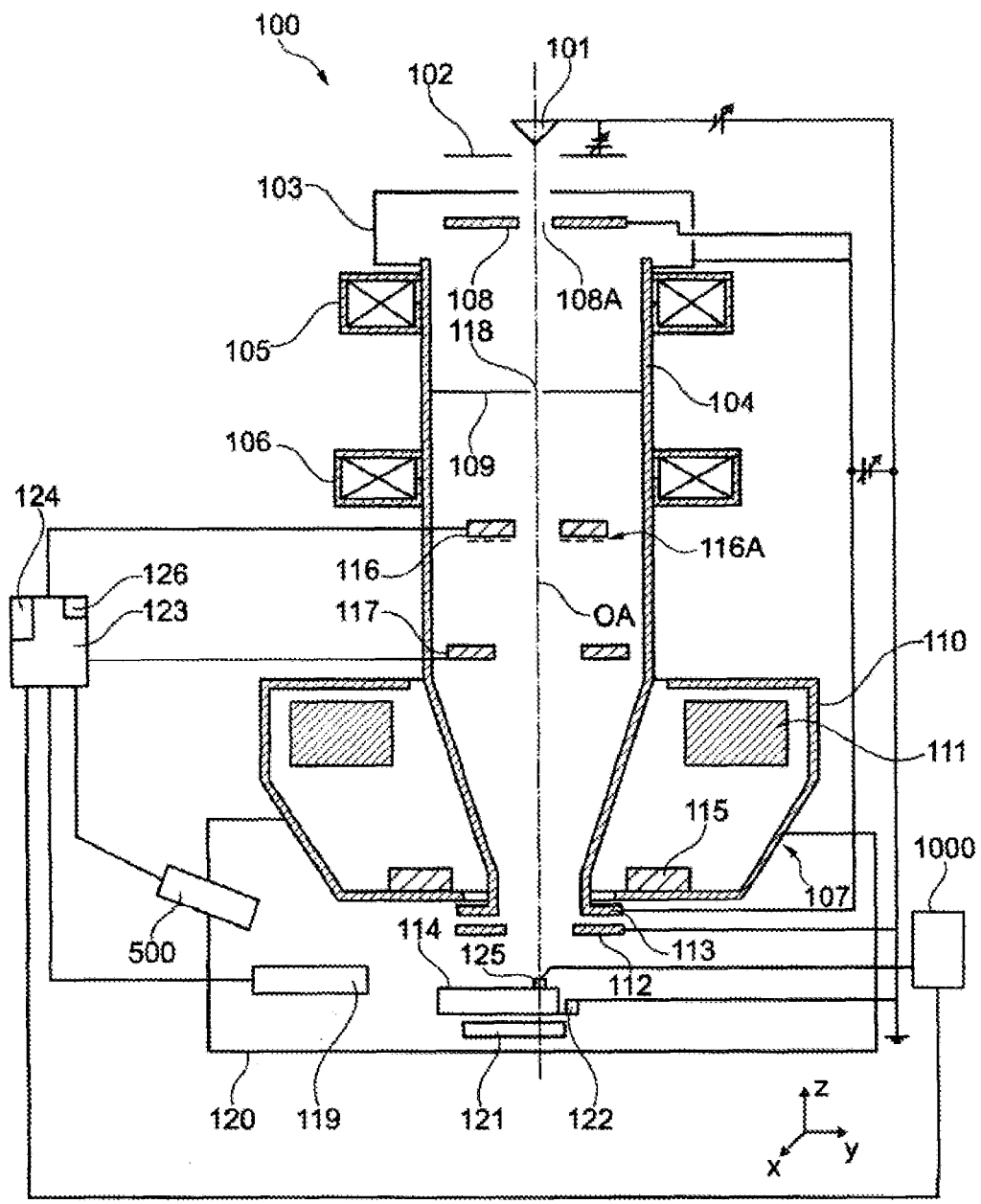
FIG. 1 shows a first embodiment of a particle beam apparatus.

FIG. 1 shows a schematic illustration of an SEM 100. The SEM 100 includes a first beam generator in the form of an electron source 101, which is designed as a cathode. Further, the SEM 100 is provided with an extraction electrode 102 and with an anode 103, which is placed onto one end of a beam guiding tube 104 of the SEM 100. By way of example, the electron source 101 is embodied as a thermal field emitter. However, the invention is not restricted to such an electron source 101. Rather, any electron source is utilizable.

Electrons emerging from the electron source 101 form a primary electron beam. The electrons are accelerated to anode potential owing to a potential difference between the electron source 101 and the anode 103. In the embodiment shown in FIG. 1, the anode potential is 100 V to 35 kV, for example 5 kV to 15 kV, in particular 8 kV, relative to an earth potential of a housing of a sample chamber 120. However, alternatively the anode potential could also be at earth potential.

Two condenser lenses, specifically a first condenser lens 105 and a second condenser lens 106, are arranged at the beam guiding tube 104. Proceeding from the electron source 101 as viewed in the direction of a first objective lens 107, the first condenser lens 105 is arranged first, followed by the second condenser lens 106. It is expressly pointed out that further embodiments of the SEM 100 may include only a single condenser lens. A first aperture unit 108 is arranged between the anode 103 and the first condenser lens 105. Together with the anode 103 and the beam guiding tube 104, the first aperture unit 108 is at a high-voltage potential, specifically the potential of the anode 103, or connected to earth. The first aperture unit 108 has numerous first apertures 108A, of which one is depicted in FIG. 1. By way of example, two first apertures 108A are present. Each one of the numerous first apertures 108A has a different aperture diameter. Using an adjustment mechanism (not depicted), it is possible to set a desired first aperture 108A onto an optical axis OA of the SEM 100. Reference is explicitly made to the fact that, in further embodiments, the first aperture unit 108 may be provided with only a single aperture 108A. In the embodiment of FIG. 1, an adjustment mechanism may not be provided. The first aperture unit 108 is then designed to be stationary. A stationary second aperture unit 109 is arranged between the first condenser lens 105 and the second condenser lens 106. As an alternative thereto, provision is made for the second aperture unit 109 to be designed to be movable.

The first objective lens 107 includes pole pieces 110, in which a hole is formed. The beam guiding tube 104 is guided through the hole. A coil 111 is arranged in the pole pieces 110.

An electrostatic retardation device is arranged in a lower region of the beam guiding tube 104. The electrostatic retardation device includes an individual electrode 112 and a tube electrode 113. The tube electrode 113 is arranged at one end of the beam guiding tube 104, the end facing an object 125 that is arranged at an object holder 114 designed to be movable.

Together with the beam guiding tube 104, the tube electrode 113 is at the potential of the anode 103, while the individual electrode 112 and the object 125 are at a lower potential in relation to the potential of the anode 103. In the present case, the lower potential is the earth potential of the housing of the sample chamber 120 so that the electrons of the primary electron beam can be decelerated to a desired energy which is required for examining the object 125.

The SEM 100 further includes a scanning device 115 that deflects the primary electron beam and scans the primary electron beam over the object 125. The electrons of the primary electron beam interact with the object 125. As a result of the interaction, interaction particles arise, which are detected. In particular, electrons are emitted from the surface of the object 125—so-called secondary electrons—or electrons of the primary electron beam are backscattered—so-called backscattered electrons—as interaction particles.

The object 125 and the individual electrode 112 can also be at different potentials and potentials different from earth. It is thereby possible to set the location of the retardation of the primary electron beam in relation to the object 125. By way of example, if the retardation is carried out relatively close to the object 125, imaging aberrations become smaller.

A detector arrangement including a first detector 116 and a second detector 117 is arranged in the beam guiding tube 104 for detecting the secondary electrons and/or the backscattered electrons. Here, the first detector 116 is arranged on the source side along the optical axis OA, while the second detector 117 is arranged on the object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and of the beam guiding tube 104. The optical axis OA of the SEM 100 runs through the respective passage openings.

The second detector 117 serves principally for detecting secondary electrons. Upon emerging from the object 125, the secondary electrons initially have a low kinetic energy and random directions of motion. Using the strong extraction field emanating from the tube electrode 113, the secondary electrons are accelerated in the direction of the first objective lens 107. The secondary electrons enter the first objective lens 107 approximately parallel. The beam diameter of the beam of the secondary electrons remains small in the first objective lens 107 as well. The first objective lens 107 then has a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can additionally be designed with an opposing field grid 116A. The opposing field grid 116A is arranged at the side of the first detector 116 directed towards the object 125. With respect to the potential of the beam guiding tube 104, the opposing field grid 116A has a negative potential such that only backscattered electrons with a high energy pass through the opposing field grid 116A to the first detector 116.

Additionally or as an alternative, the second detector 117 includes a further opposing field grid, which has an analogous embodiment to the aforementioned opposing field grid 116A of the first detector 116 and which has an analogous function.

Further, the SEM 100 includes in the sample chamber 120 a chamber detector 119, for example an Everhart-Thornley detector or an ion detector, which has a detection surface that is coated with metal and blocks light.

The detection signals generated by the first detector 116, the second detector 117, and the chamber detector 119 are used to generate an image or images of the surface of the object 125.

It is expressly pointed out that the apertures of the first aperture unit 108 and of the second aperture unit 109, as well as the passage openings of the first detector 116 and of the second detector 117, are depicted in exaggerated fashion. The passage openings of the first detector 116 and of the second detector 117 have an extent perpendicular to the optical axis OA in the range of 0.5 mm to 5 mm. By way of example, the passage openings are of circular design and have a diameter in the range of 1 mm to 3 mm perpendicular to the optical axis OA.

The second aperture unit 109 is configured as a pinhole aperture unit in the embodiment illustrated in FIG. 1 and is provided with a second aperture 118 for the passage of the primary electron beam, which has an extent in the range from 5 μm to 500 μm, e.g. 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is designed as a pressure stage aperture unit that separates a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. For the purposes of producing the vacuum, a pump (not depicted) is arranged at the sample chamber 120. In the embodiment depicted in FIG. 1, the sample chamber 120 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 120 is vacuum-sealed.

The object holder 114 is arranged at an object carrier in the form of a sample stage 122. The sample stage 122 is designed to be movable in three directions arranged perpendicular to one another, specifically in an x-direction (first stage axis), in a y-direction (second stage axis) and in a z-direction (third stage axis). Moreover, the sample stage 122 can be rotated about two rotation axes which are arranged perpendicular to one another (stage rotation axes). The invention is not restricted to the sample stage 122 described above. Rather, the sample stage 122 can have further translation axes and rotation axes along which or about which the sample stage 122 can move. This is discussed in greater detail further below.

The SEM 100 further includes a third detector 121, which is arranged in the sample chamber 120. More precisely, the third detector 121 is arranged downstream of the sample stage 122, as viewed from the electron source 101 along the optical axis OA. The sample stage 122, and hence the object holder 114, can be rotated in such a way that the primary electron beam can radiate through the object 125 arranged at the object holder 114. When the primary electron beam passes through the object 125 to be examined, the electrons of the primary electron beam interact with the material of the object 125 to be examined. The electrons passing through the object 125 to be examined are detected by the third detector 121.

Arranged at the sample chamber 120 is a radiation detector 500, which is used to detect interaction radiation, for example x-ray radiation and/or cathodoluminescent light. The radiation detector 500, the first detector 116, the second detector 117, and the chamber detector 119 are connected to a control unit 123, which includes a processor and a monitor 124. The third detector 121 is also connected to the control unit 123, which is not depicted for reasons of clarity. The control unit 123 processes detection signals that are generated by the first detector 116, the second detector 117, the chamber detector 119, the third detector 121 and/or the radiation detector 500 and displays the detection signals in the form of images on the monitor 124.

The control unit 123 furthermore has a database 126, in which data are stored and from which data are read out.

The SEM 100 includes a system with a gas feed device 1000, which serves to feed a gas, for example a gaseous precursor substance, to a specific position on the surface of the object 125. The gas feed device 1000 is discussed in more detail further below.

Figure 2:
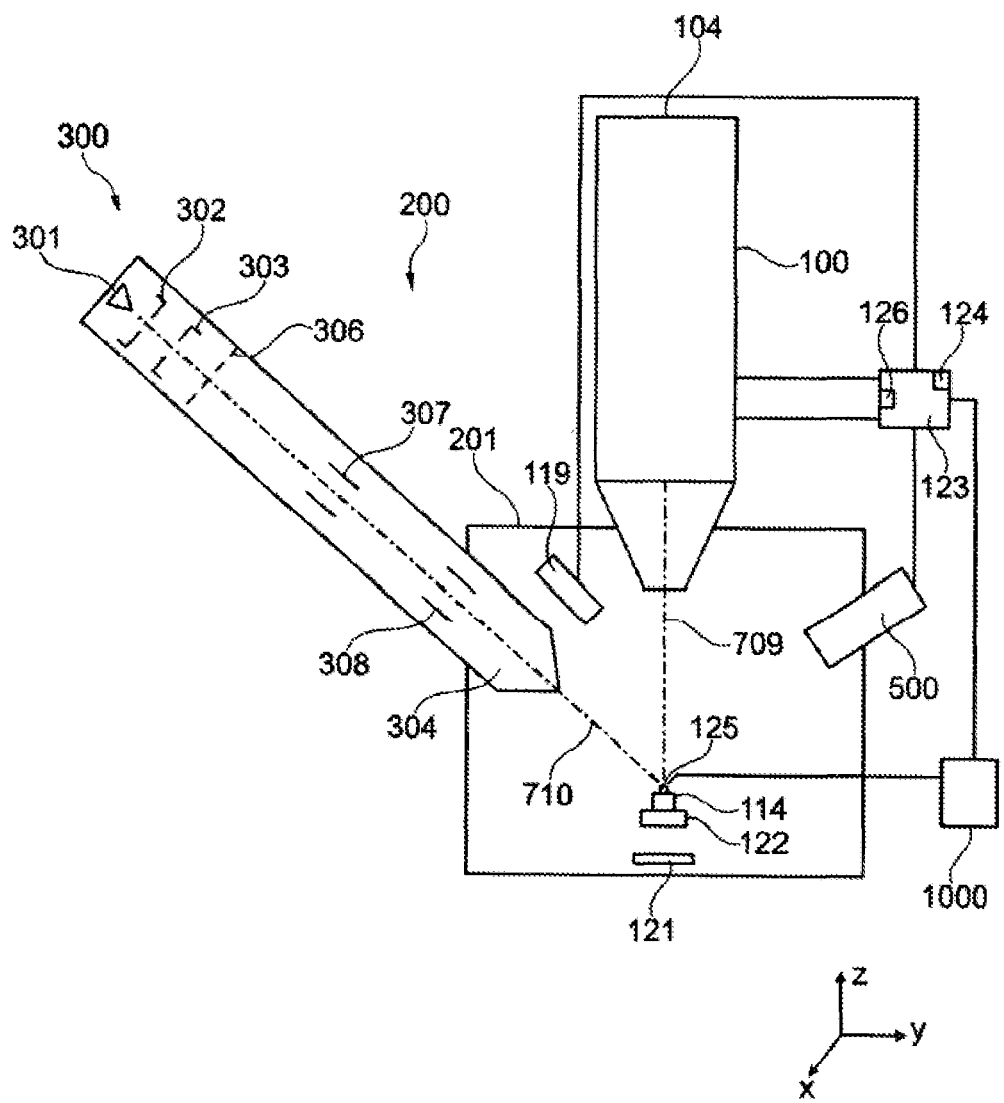
FIG. 2 shows a second embodiment of a particle beam apparatus.

FIG. 2 shows a particle beam apparatus in the form of a combination apparatus 200. The combination apparatus 200 includes two particle beam columns. Firstly, the combination apparatus 200 is provided with the SEM 100, as already depicted in FIG. 1, but without the sample chamber 120. Rather, the SEM 100 is arranged at a sample chamber 201. The sample chamber 201 is under vacuum. For the purposes of producing the vacuum, a pump (not depicted) is arranged at the sample chamber 201. In the embodiment depicted in FIG. 2, the sample chamber 201 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 201 is vacuum-sealed.

Arranged in the sample chamber 201 is the chamber detector 119 which is designed, for example, in the form of an Everhart-Thornley detector or an ion detector and which has a detection surface coated with metal and that blocks light. Further, the third detector 121 is arranged in the sample chamber 201.

The SEM 100 serves to generate a first particle beam, specifically the primary electron beam described above, and has the optical axis, described above, which is provided with a reference sign 709 in FIG. 2 and which is also referred to as first beam axis below. Secondly, the combination apparatus 200 is provided with an ion beam apparatus 300, which is likewise arranged at the sample chamber 201. The ion beam apparatus 300 likewise has an optical axis, which is provided with a reference sign 710 in FIG. 2 and which is also referred to as a second beam axis below.

The SEM 100 is arranged vertically in relation to the sample chamber 201. By contrast, the ion beam apparatus 300 is arranged in a manner inclined by an angle of approx. 0° to 90° in relation to the SEM 100. An arrangement of approx. 50° is depicted by way of example in FIG. 2. The ion beam apparatus 300 includes a second beam generator in the form of an ion beam generator 301. Ions, which form a second particle beam in the form of an ion beam, are generated by the ion beam generator 301. The ions are accelerated using an extraction electrode 302, which is at a predefinable potential. The second particle beam then passes through an ion optical unit of the ion beam apparatus 300, where the ion optical unit includes a condenser lens 303 and a second objective lens 304. The second objective lens 304 ultimately generates an ion probe, which is focused onto the object 125 arranged at an object holder 114. The object holder 114 is arranged at a sample stage 122.

An adjustable or selectable aperture unit 306, a first electrode arrangement 307, and a second electrode arrangement 308 are arranged above the second objective lens 304 (i.e., in the direction of the ion beam generator 301), with the first electrode arrangement 307 and the second electrode arrangement 308 being embodied as scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction, which is counter to the first direction. Thus, scanning is carried out in an x-direction, for example. The scanning in a y-direction perpendicular thereto is brought about by further electrodes (not depicted), which are rotated by 90°, at the first electrode arrangement 307 and at the second electrode arrangement 308.

As explained above, the object holder 114 is arranged at the sample stage 122. In the embodiment shown in FIG. 2, too, the sample stage 122 is designed to be movable in three directions arranged perpendicular to one another, specifically in an x-direction (first stage axis), in a y-direction (second stage axis) and in a z-direction (third stage axis). Moreover, the sample stage 122 can be rotated about two rotation axes which are arranged perpendicular to one another (stage rotation axes).

The distances depicted in FIG. 2 between the individual units of the combination apparatus 200 are depicted in exaggerated fashion in order to better illustrate the individual units of the combination apparatus 200.

Arranged at the sample chamber 201 is a radiation detector 500, which is used to detect interaction radiation, for example x-ray radiation and/or cathodoluminescent light. The radiation detector 500 is connected to a control unit 123, which includes a processor and a monitor 124. The control unit 123 processes detection signals that are generated by the first detector 116, the second detector 117 (not illustrated in FIG. 2), the chamber detector 119, the third detector 121 and/or the radiation detector 500 and displays the detection signals in the form of images on the monitor 124.

The control unit 123 furthermore has a database 126, in which data are stored and from which data are read out.

The combination apparatus 200 includes a system with a gas feed device 1000, which serves to feed a gas, for example a gaseous precursor substance, to a specific position on the surface of the object 125. The gas feed device 1000 is discussed in more detail further below.

Figure 3:
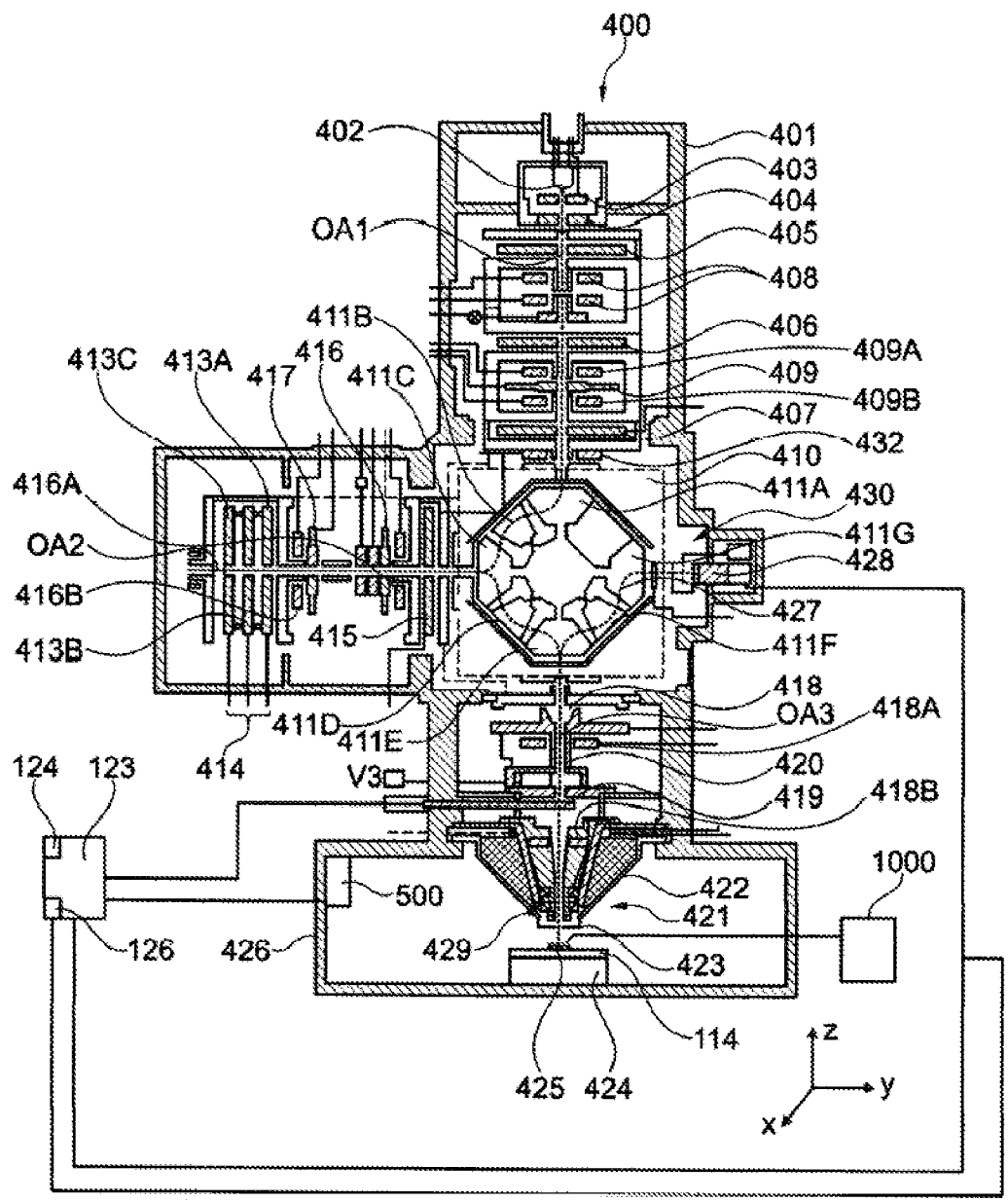
FIG. 3 shows a third embodiment of a particle beam apparatus.

FIG. 3 is a schematic illustration of a further embodiment of a particle beam apparatus according to the system described herein. The embodiment of the particle beam apparatus shown in FIG. 3 is provided with a reference sign 400 and includes a mirror corrector for correcting chromatic and/or spherical aberrations, for example. The particle beam apparatus 400 includes a particle beam column 401, which is embodied as an electron beam column and which substantially corresponds to an electron beam column of a corrected SEM. However, the particle beam apparatus 400 is not restricted to an SEM with a mirror corrector. Rather, the particle beam apparatus can include any type of corrector units.

The particle beam column 401 includes a particle beam generator in the form of an electron source 402 (cathode), an extraction electrode 403, and an anode 404. By way of example, the electron source 402 is designed as a thermal field emitter. Electrons emerging from the electron source 402 are accelerated to the anode 404 owing to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is set along the beam path using a beam guiding device. The beam guiding device of the embodiment of FIG. 3 includes a source setting unit with two magnetic deflection units 408 arranged along the first optical axis OA1. Moreover, the particle beam apparatus 400 includes electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at an other side of the first electrostatic beam deflection unit 409. The first electrostatic beam deflection unit 409, the first multi-pole unit 409A, and the second multi-pole unit 409B are set for the purposes of setting the particle beam with respect to the axis of the third electrostatic lens 407 and the entrance window of a beam deflection device 410. The first electrostatic beam deflection unit 409, the first multi-pole unit 409A, and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and the particle beam is deflected by the beam deflection device 410 in the direction of a second optical axis OA2. The beam deflection is performed using the first magnetic sector 411A, using the second magnetic sector 411B, and using the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 is provided by deflection of the particle beam at an angle of 90°. Hence, the third optical axis OA3 runs coaxially with respect to the first optical axis OA1. However, it is pointed out that the particle beam apparatus 400 according to the invention described here is not restricted to deflection angles of 90°. Rather, any suitable deflection angle can be selected by the beam deflection device 410, for example 70° or 110°, such that the first optical axis OA1 does not run coaxially with respect to the third optical axis OA3. With respect to further details of the beam deflection device 410, reference is made to WO 2002/067286 A2.

After the particle beam has been deflected by the first magnetic sector 411A, the second magnetic sector 411b, and the third magnetic sector 411C, the particle beam is guided along the second optical axis OA2. The particle beam is guided to an electrostatic mirror 414 and travels on a path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 4166 in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons are deflected with respect to the third optical axis OA3 by the third magnetic sector 411C, the fourth magnetic sector 411D, and the fifth magnetic sector 411E.

The electrons of the particle beam emerge from the beam deflection device 410 and the electrons are guided along the third optical axis OA3 to an object 425 that is intended to be examined and is arranged in an object holder 114. On the path to the object 425, the particle beam is guided to a fifth electrostatic lens 418, a beam guiding tube 420, a fifth multi-pole unit 418A, a sixth multi-pole unit 4186, and an objective lens 421. The fifth electrostatic lens 418 is an electrostatic immersion lens. By way of the fifth electrostatic lens 418, the particle beam is decelerated or accelerated to an electric potential of the beam guiding tube 420.

Using the objective lens 421, the particle beam is focused into a focal plane in which the object 425 is arranged. The object holder 114 is arranged at a movable sample stage 424. The movable sample stage 424 is arranged in a sample chamber 426 of the particle beam apparatus 400. The sample stage 424 is designed to be movable in three directions arranged perpendicular to one another, specifically in an x-direction (first stage axis), in a y-direction (second stage axis) and in a z-direction (third stage axis). Moreover, the sample stage 424 can be rotated about two rotation axes which are arranged perpendicular to one another (stage rotation axes). This is discussed in greater detail further below.

The sample chamber 426 is under vacuum. For the purposes of producing the vacuum, a pump (not depicted) is arranged at the sample chamber 426. In the embodiment depicted in FIG. 3, the sample chamber 426 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 426 is vacuum-sealed.

The objective lens 421 can be designed as a combination of a magnetic lens 422 and a sixth electrostatic lens 423. The end of the beam guiding tube 420 can furthermore be an electrode of an electrostatic lens. After emerging from the beam guiding tube 420, particles of the particle beam apparatus are decelerated to a potential of the object 425. The objective lens 421 is not restricted to a combination of the magnetic lens 422 and the sixth electrostatic lens 423. Rather, the objective lens 421 can assume any suitable form. By way of example, the objective lens 421 can also be designed as a purely magnetic lens or as a purely electrostatic lens.

The particle beam which is focused onto the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons travelling in directions oriented at a large angle with respect to the third optical axis OA3 are detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F, and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the interaction region of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. The display unit is, for example, a monitor 124 that is arranged at the control unit 123.

The second analysis detector 428 is also connected to the control unit 123. Detection signals of the second analysis detector 428 are passed to the control unit 123 and used to generate an image of the scanned region of the object 425 and to display the image on a display unit. The display unit is for example the monitor 124 that is arranged at the control unit 123.

Arranged at the sample chamber 426 is a radiation detector 500, which is used to detect interaction radiation, for example x-ray radiation and/or cathodoluminescent light. The radiation detector 500 is connected to the control unit 123, which includes a processor and the monitor 124. The control unit 123 processes detection signals of the radiation detector 500 and displays the signals in the form of images on the monitor 124.

The control unit 123 furthermore has a database 126, in which data are stored and from which data are read out.

The particle beam apparatus 400 includes a system having a gas feed device 1000, which serves to feed a gas, for example a gaseous precursor substance, to a specific position on the surface of the object 425. The gas feed device 1000 is discussed in more detail further below.

The gas feed device 1000 is discussed in more detail with respect to the SEM 100 below. The following applies correspondingly with respect to the gas feed device 1000 for the combination apparatus 200 and the particle beam apparatus 400.

Figure 4:
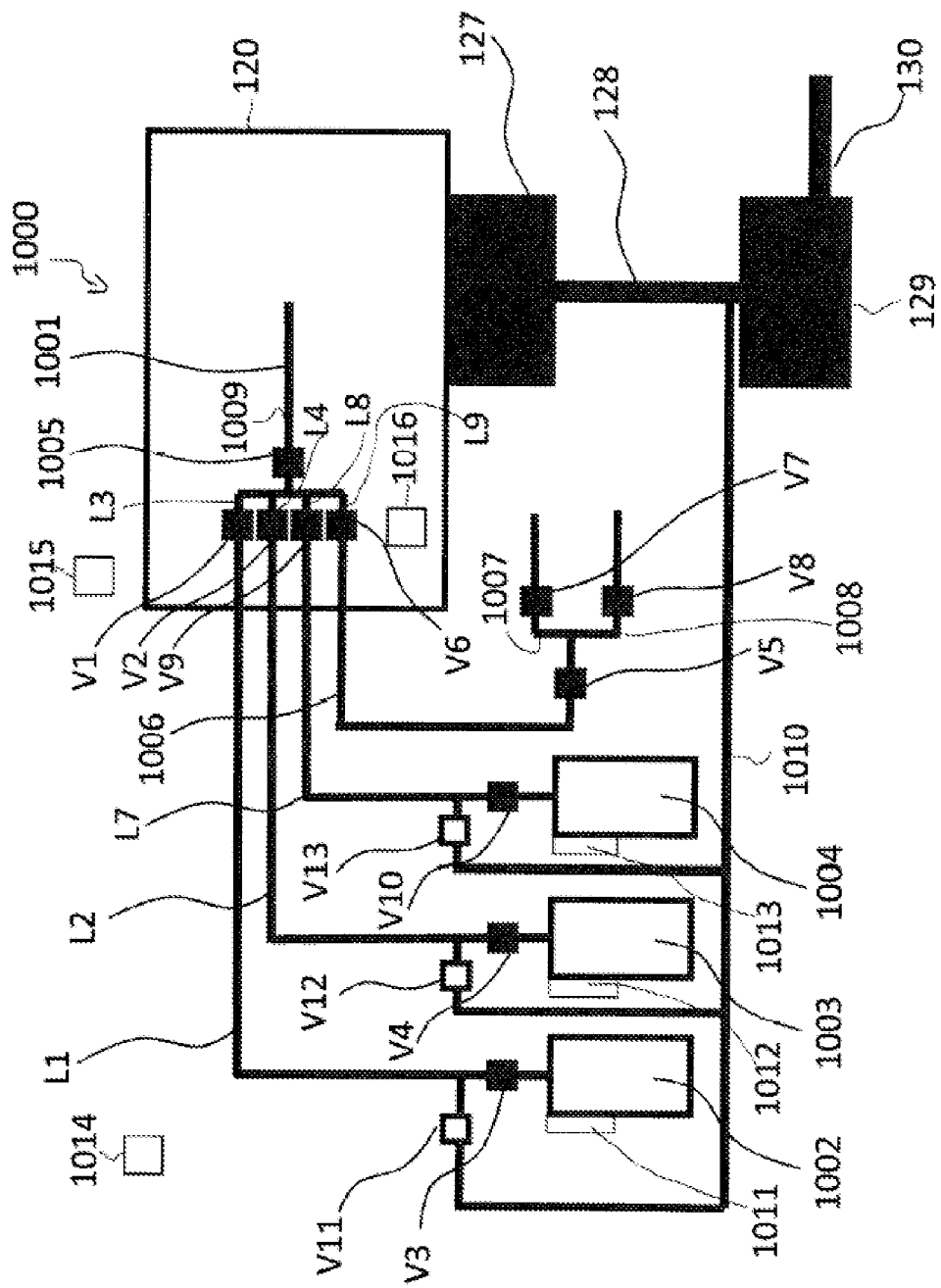
FIG. 4 shows a schematic illustration of a sample chamber and of a gas feed device.

FIG. 4 shows a schematic illustration of the sample chamber 120 of the SEM 100. By way of example, a first pump 127 which is connected via a pump line 128 to a second pump 129 is arranged at the sample chamber 120. The second pump 129 has an outlet 130. By way of example, the first pump 127 is embodied as a turbomolecular pump. Additionally or as an alternative thereto, provision is made for the second pump 129 to be embodied as a fore-pump. The invention is not restricted to the two above-mentioned pumps. Rather, any type of pump that is suitable for the invention can be used.

FIG. 4 likewise shows an embodiment of the gas feed device 1000 according to the system described herein. The gas feed device 1000 according to the system described herein thus has a first precursor reservoir 1002 for receiving a first precursor, a second precursor reservoir 1003 for receiving a second precursor and a third precursor reservoir 1004 for receiving a third precursor.

The first precursor is arranged, for example, in the solid state or in the liquid state in the first precursor reservoir 1002. The solid state or the liquid state of the first precursor is in equilibrium with the gaseous state of the first precursor. The individual atoms and molecules of the gaseous state of the first precursor determine the vapour pressure of the first precursor. If the first precursor reservoir 1002 is opened by opening of a valve of the first precursor reservoir 1002, the gaseous state of the first precursor is let out of the first precursor reservoir 1002. This is discussed in more detail further below.

The second precursor is arranged, for example, in the solid state or in the liquid state in the second precursor reservoir 1003. The solid state or the liquid state of the second precursor is in equilibrium with the gaseous state of the second precursor. The individual atoms and molecules of the gaseous state of the second precursor determine the vapour pressure of the second precursor. If the second precursor reservoir 1003 is opened by opening of a valve of the second precursor reservoir 1003, the gaseous state of the second precursor is let out of the second precursor reservoir 1003. This is discussed in more detail further below.

The third precursor is arranged, for example, in the solid state or in the liquid state in the third precursor reservoir 1004. The solid state or the liquid state of the third precursor is in equilibrium with the gaseous state of the third precursor. The individual atoms and molecules of the gaseous state of the third precursor determine the vapour pressure of the third precursor. If the third precursor reservoir 1004 is opened by opening of a valve of the third precursor reservoir 1004, the gaseous state of the third precursor is let out of the third precursor reservoir 1004. This is discussed in more detail further below.

Explicit reference is made to the fact that the invention is not restricted to the use of two or three precursor reservoirs. Rather, any number of precursor reservoirs suitable for the invention can be used in the invention.

As mentioned above, a precursor is a precursor substance which is used in the system described herein in order to deposit material on a surface of an object during interaction with a particle beam. For example, phenanthrene is used as the first precursor, the second precursor and/or the third precursor. Essentially, a layer of carbon or a carbon-containing layer is then deposited on the surface of the object 125. As an alternative thereto, by way of example, a precursor substance including metal can be used in order to deposit a metal on the surface of the object 125. However, the depositions are not limited to carbon and/or metals. Rather, any substances can be deposited on the surface of the object 125, for example semiconductors, non-conductors or other compounds. Furthermore, provision is also made, by way of example, for the gaseous state of the precursor to be used for ablating material of the object 125 upon interaction with the particle beam.

The gas feed device 1000 has a feed unit 1001 for the feed of the gaseous state of the first precursor, the gaseous state of the second precursor and/or the gaseous state of the third precursor onto the surface of the object 125. In the embodiment illustrated in FIG. 4, only a single feed unit 1001 is provided for the feed of the gaseous state of the first precursor, the gaseous state of the second precursor and/or the gaseous state of the third precursor onto the surface of the object 125. The single feed unit 1001 therefore serves for the feed of the gaseous state of a plurality of precursors (for example the first precursor, the second precursor and the third precursor), where the feed of the gaseous state of the plurality of precursors preferably does not take place simultaneously, but rather the gaseous state of the individual precursors is fed temporally successively to the surface of the object 125. As an alternative thereto, provision is made for the gas feed unit 1000 to have a plurality of feed units 1001 for the feed of the gaseous state of the first precursor, the gaseous state of the second precursor and/or the gaseous state of the third precursor onto the surface of the object 125.

For example, the feed unit 1001 is embodied as a cannula and/or is acicular. For example, the feed unit 1001 has a feed opening, the diameter of which is for example in the range of 10 μm to 1000 μm, in particular in the range of 400 μm to 600 μm.

The gas feed device 1000 has a first line device L1 for conducting the gaseous state of the first precursor to the feed unit 1001, the first line device L1 being arranged between the first precursor reservoir 1002 and the feed unit 1001. Moreover, the gas feed device 1000 is provided with a second line device L2 for conducting the gaseous state of the second precursor to the feed unit 1001, the second line device L2 being arranged between the second precursor reservoir 1003 and the feed unit 1001. A seventh line device L7 for conducting the gaseous state of the third precursor to the feed unit 1001 is arranged between the third precursor reservoir 1004 and the feed unit 1001.

The gas feed device 1000 has a first valve V1 for controlling the inflow of the gaseous state of the first precursor, the first valve V1 being arranged between the first line device L1 and the feed unit 1001. Furthermore, the gas feed device 1000 has a second valve V2 for controlling the inflow of the gaseous state of the second precursor, the second valve V2 being arranged between the second line device L2 and the feed unit 1001. Moreover, the gas feed device 1000 has a ninth valve V9 for controlling the inflow of the gaseous state of the third precursor, the ninth valve V9 being arranged between the seventh line device L7 and the feed unit 1001.

The gas feed device 1000 has further valves. A third valve V3 for controlling the inflow of the gaseous state of the first precursor is arranged at the gas feed device 1000, the third valve V3 being arranged between the first line device L1 and the first precursor reservoir 1002. Furthermore, a fourth valve V4 for controlling the inflow of the gaseous state of the second precursor is arranged at the gas feed device 1000, the fourth valve V4 being arranged between the second line device L2 and the second precursor reservoir 1003. A tenth valve V10 for controlling the inflow of the gaseous state of the third precursor is likewise arranged at the gas feed device 1000, the tenth valve V10 being arranged between the seventh line device L7 and the third precursor reservoir 1004.

The gas feed device 1000 furthermore has a control valve 1005 for controlling the inflow of the gaseous state of the first precursor, the gaseous state of the second precursor and/or the gaseous state of the third precursor to the feed unit 1001. The control valve 1005 is connected to the first valve V1 by a third line device L3. Furthermore, the control valve 1005 is connected to the second valve V2 by a fourth line device L4. The control valve 1005 is connected to the ninth valve V9 by an eighth line device L8.

In the gas feed device 1000, provision is made that first, the third valve V3 and then the first valve V1 are arranged along the first line device L1 as seen from the first precursor reservoir 1002 in the direction of flow of the gaseous state of the first precursor to the feed unit 1001. Furthermore, in the gas feed device 1000, provision is made that first, the fourth valve V4 and then the second valve V2 are arranged along the second line device L2 as seen from the second precursor reservoir 1003 in the direction of flow of the gaseous state of the second precursor to the feed unit 1001. Moreover, first, the tenth valve V10 and then the ninth valve V9 are arranged along the seventh line device L7 as seen from the third precursor reservoir 1004 in the direction of flow of the gaseous state of the third precursor to the feed unit 1001.

In the embodiment of the gas feed device 1000 illustrated in FIG. 4, the first valve V1, the second valve V2, the ninth valve V9 and/or the control valve 1005 is/are embodied as a micro-valve. A micro-valve is understood herein as a valve which is embodied as a small component. A micro-valve is used in fluidics and in micro-fluidics in order to control the course of gases or liquids. A micro-valve is quite a small valve. For example, an external dimension, in particular an external diameter of a micro-valve, is smaller than 10 mm. A longitudinal extent of a micro-valve is, for example, smaller than 50 mm. In particular, a micro-valve has an external diameter of approx. 6 mm and a longitudinal extent of approx. 35 mm. Furthermore, in the embodiment of the gas feed device 1000 illustrated in FIG. 4, provision is made that the first valve V1, the second valve V2, the ninth valve V9 and/or the control valve 1005 is/are each embodied as a pulsed valve. As used herein, a pulsed valve is understood as meaning a valve which is activated with a pulse frequency and can be brought alternatively into a closed state and into an open state in accordance with the pulse frequency. For example, the pulse frequency lies in the range from 5 Hz to 50 Hz or in the range from 10 Hz to 30 Hz, with the range limits being included in the aforementioned ranges. In particular, the pulse frequency is 10 Hz.

In the embodiment of the gas feed device 1000 that is illustrated in FIG. 4, the gas feed device 1000 has a cleaning line 1006 for the feed of a cleaning gas, the cleaning line 1006 being arranged between a fifth valve V5 for controlling the inflow of the cleaning gas and the control valve 1005. Furthermore, in the embodiment of the gas feed device 1000 illustrated in FIG. 4, a sixth valve V6 for controlling the inflow of the cleaning gas is provided, where first, the fifth valve V5 and then the sixth valve V6 are arranged, as seen in the direction of flow of the cleaning gas along the cleaning line 1006. The sixth valve V6 is connected to the control valve 1005, and therefore to the feed unit 1001, via a ninth line device L9. Using the cleaning gas, it is possible, on the one hand, to clean at least one of the above-mentioned line devices L1, L2, L3, L4, L7 and L8 and/or the feed unit 1001 in such a manner that a good functioning of the gas feed device 1000 is ensured.

In the embodiment illustrated of the gas feed device 1000, provision is made that the fifth valve V5 is embodied as a needle valve and/or the sixth valve V6 as a micro-valve and/or the sixth valve V6 as a pulsed valve.

The gas feed device 1000 also has a first cleaning line device 1007 for conducting the cleaning gas into the cleaning line 1006, the first cleaning line device 1007 being arranged between the fifth valve V5 and a seventh valve V7 for controlling the inflow of the cleaning gas. The seventh valve V7 is arranged at the gas feed device 1000. For example, the seventh valve V7 is connected to a first cleaning gas reservoir (not illustrated) for the feed of a first cleaning gas. For example, nitrogen or oxygen is used as the first cleaning gas. Furthermore, the gas feed device 1000 has a second cleaning line device 1008 for conducting a cleaning gas into the cleaning line 1006, the second cleaning line device 1008 being arranged between the fifth valve V5 and an eighth valve V8 for controlling the inflow of the cleaning gas. The eighth valve V8 is arranged at the gas feed device 1000. For example, the eighth valve V8 is connected to a second cleaning gas reservoir (not illustrated) for the feed of a second cleaning gas. For example, nitrogen or oxygen is used as the second cleaning gas.

The control valve 1005 is arranged between the first valve V1 and the feed unit 1001, between the second valve V2 and the feed unit 1001, between the ninth valve V9 and the feed unit 1001 and between the sixth valve V6 and the feed unit 1001.

Furthermore, the control valve 1005 is connected to the feed unit 1001 for the feed of the gaseous state of the first precursor, the gaseous state of the second precursor, the gaseous state of the third precursor and/or an above-mentioned cleaning gas. For example, the control valve 1005 is connected to the feed unit 1001 via a line 1009. Additionally or as an alternative thereto, provision is made for the control valve 1005 to be part of the feed unit 1001.

The first line device L1 is connected to an evacuation line 1010 via an eleventh valve V11, the evacuation line 1010 being connected to the pump line 128. The eleventh valve V11 is arranged downstream of the third valve V3, as seen in the direction of flow of the gaseous state of the first precursor in the direction of the feed unit 1001. For example, the third valve V3 is embodied as a 2-way valve. Furthermore, the second line device L2 is connected via a twelfth valve V12 to the evacuation line 1010 which is connected to the pump line 128. The twelfth valve V12 is arranged downstream of the fourth valve V4, as seen in the direction of flow of the gaseous state of the second precursor in the direction of the feed unit 1001. For example, the fourth valve V4 is embodied as a 2-way valve. Furthermore, the seventh line device L7 is connected via a thirteenth valve V13 to the evacuation line 1010 which is connected to the pump line 128. The thirteenth valve V13 is arranged downstream of the tenth valve V10, as seen in the direction of flow of the gaseous state of the third precursor in the direction of the feed unit 1001. For example, the tenth valve V10 is embodied as a 2-way valve. As an alternative to the previously described embodiment, the eleventh valve V11, the twelfth valve V12 and the thirteenth valve V13 can each be connected to a separate evacuation line, the evacuation lines each being connected, for example, to the pump line 128. For example, the eleventh valve V11 is connected in an opposed manner to the third valve V3. In other words, the eleventh valve V11 is opened when the third valve V3 is closed (and vice versa). For example, the twelfth valve V12 is connected in an opposed manner to the fourth valve V4. In other words, the twelfth valve V12 is opened when the fourth valve V4 is closed (and vice versa). For example, the thirteenth valve V13 is connected in an opposed manner to the tenth valve V10. In other words, the thirteenth valve V13 is opened when the tenth valve V10 is closed (and vice versa).

The embodiment of the gas feed device 1000 according to FIG. 4 has
- (i) a first heating and/or cooling device 1011 for heating and/or cooling the first precursor reservoir 1002,
- (ii) a second heating and/or cooling device 1012 for heating and/or cooling the second precursor reservoir 1003,
- (iii) a fifth heating and/or cooling device 1013 for heating and/or cooling the third precursor reservoir 1004,
- (iv) a third heating and/or cooling device 1014 for heating and/or cooling the first line device L1, the second line device L2, the seventh line device L7, the third valve V3, the fourth valve V4 and the tenth valve V10, and
- (v) a fourth heating and/or cooling device 1015 for heating and/or cooling the first valve V1, the second valve V2, the ninth valve V9, the control valve 1005 and the feed unit 1001.

The third heating and/or cooling device 1014 and the fourth heating and/or cooling device 1015 are conductively connected to the corresponding components to be cooled and/or heated (not illustrated in FIG. 4). The above-mentioned heating and/or cooling devices ensure that the temperature of the components of the gas feed device 1000 to be correspondingly cooled or heated can be set in such a manner that the temperature of the first precursor reservoir 1002, of the second precursor reservoir 1003 and/or of the third precursor reservoir 1004 is lower than the temperature of all of the further units of the gas feed device 1000 in order to reduce and/or to prevent condensations of the first precursor, the second precursor and/or the third precursor in the further units.

The gas feed device 1000 furthermore has a heating and/or cooling unit 1016 for heating and/or cooling the sixth valve V6. The heating and/or cooling unit 1016 is conductively connected to the sixth valve V6 (not illustrated in FIG. 4). The above-mentioned embodiment ensures that the temperature of the sixth valve V6 can be set in such a manner that the temperature of the sixth valve V6 is higher than the temperature of the first precursor reservoir 1002, of the second precursor reservoir 1003 and/or of the third precursor reservoir 1004 in order to reduce and/or to prevent condensations of the first precursor, the second precursor and/or the third precursor in or on the sixth valve V6.

It has been shown that depositing of material on the object 125 is readily possible with the gas feed device 1000. Furthermore, the gas feed device 1000 can be operated in such a manner that the flow of the gaseous state of the respective precursor reaching the object 125 is essentially immediately changeable and essentially remains constant. Moreover, the gas feed device 1000 can be operated in such a manner that, when a precursor reservoir is closed, the flow of the gaseous state of the respective precursor reaching the object 125 rapidly decreases.

If, for example, the first precursor is intended to be deposited on the surface of the object 125, the eleventh valve V11 is closed, the third valve V3 is opened, the first valve V1 is opened and the control valve 1005 is opened. The gaseous state of the first precursor then flows through the first line device L1 via the first valve V1, the third line device L3 and the control valve 1005 to the feed unit 1001 and onto the surface of the object 125. The inflow of the gaseous state of the first precursor can be regulated, for example, using the first valve V1 and/or the control valve 1005. This is discussed in more detail further below.

The depositing, for example, of the gaseous state of the first precursor on the surface of the object 125 can be ended as follows if, subsequently thereto, the first precursor is intended to be deposited again on the surface of the object 125. First, the first valve V1 is closed. The third valve V3 remains open. A short period of a few seconds in which residues of the gaseous state of the first precursor are sucked off in the third line device L3 via the feed unit 1001 is then waited for. The control valve 1005 is then closed. Renewed depositing of the first precursor is started by first the control valve 1005 and then the first valve V1 being opened. It has been shown that a very rapid increase in the flow of the gaseous state of the first precursor to the object 125 is thereby achieved since the gaseous state of the first precursor no longer has to fill the first line device L1. On the contrary, the first line device L1 is already filled with the gaseous state of the first precursor.

The depositing of the gaseous state of the first precursor on the surface of the object 125 can be ended as follows if, subsequently thereto, the first precursor is not intended to be deposited once again on the surface of the object 125. First, the control valve 1005 is closed. Subsequently thereto, the third valve V3 is closed and the eleventh valve V11 opened. After approx. one minute or else after several minutes, the first valve V1 is then closed.

The above also applies analogously to the feed of the gaseous state of the second precursor and/or the gaseous state of the third precursor.

A further embodiment of the system described herein makes provision for a pressure-measuring device (not illustrated) to be arranged at the sample chamber 120 and to be used to measure the pressure in the sample chamber 120. It is possible using the pressure-measuring device to determine a pressure in the sample chamber 120 that is changed because of the feed of the gaseous state of a corresponding precursor and, by adaptation of the opening ratio of the first valve V1, the second valve V2, the ninth valve V9 and the control valve 1005, to achieve a corresponding desired target pressure within the sample chamber 120. In particular, together with setting of the temperature of the corresponding precursor, opening the valves as set forth above permits rapid setting of the flow of the gaseous state of the corresponding precursor to the surface of the object 125.

The first valve V1, the second valve V2, the ninth valve V9, the sixth valve V6 and the control valve 1005 can be opened and closed, for example, in the manner of 2-way valves. Additionally or alternatively thereto, the above-mentioned valves can also be operated in pulsed fashion, as already explained above. In particular, provision is made to use a pulse frequency of 10 Hz and to vary the pulse duration between 0 ms and 100 ms. It has been shown that a virtually constant flow of the gaseous state of the corresponding precursor to the surface of the object 125 can therefore be achieved. The service life of the above-mentioned valves is then, for example, 250 hours. If the above-mentioned valves were closed for a longer time, the above-mentioned valves may not open reliably during the first pulse. In this case, the above-mentioned valves are always operated in the pulse mode for opening for a short period of time of a few seconds. Opening and closing of the above-mentioned valves is then always correct. Opening and closing of the above-mentioned valves is also carried out if the above-mentioned valves are intended to be permanently opened.

A computer program product with program code is loaded in the processor of the control unit 123. Upon execution, the program code controls the gas feed device 1000 or the SEM 100 in such a manner that various operating modes can be carried out.

Figure 5:
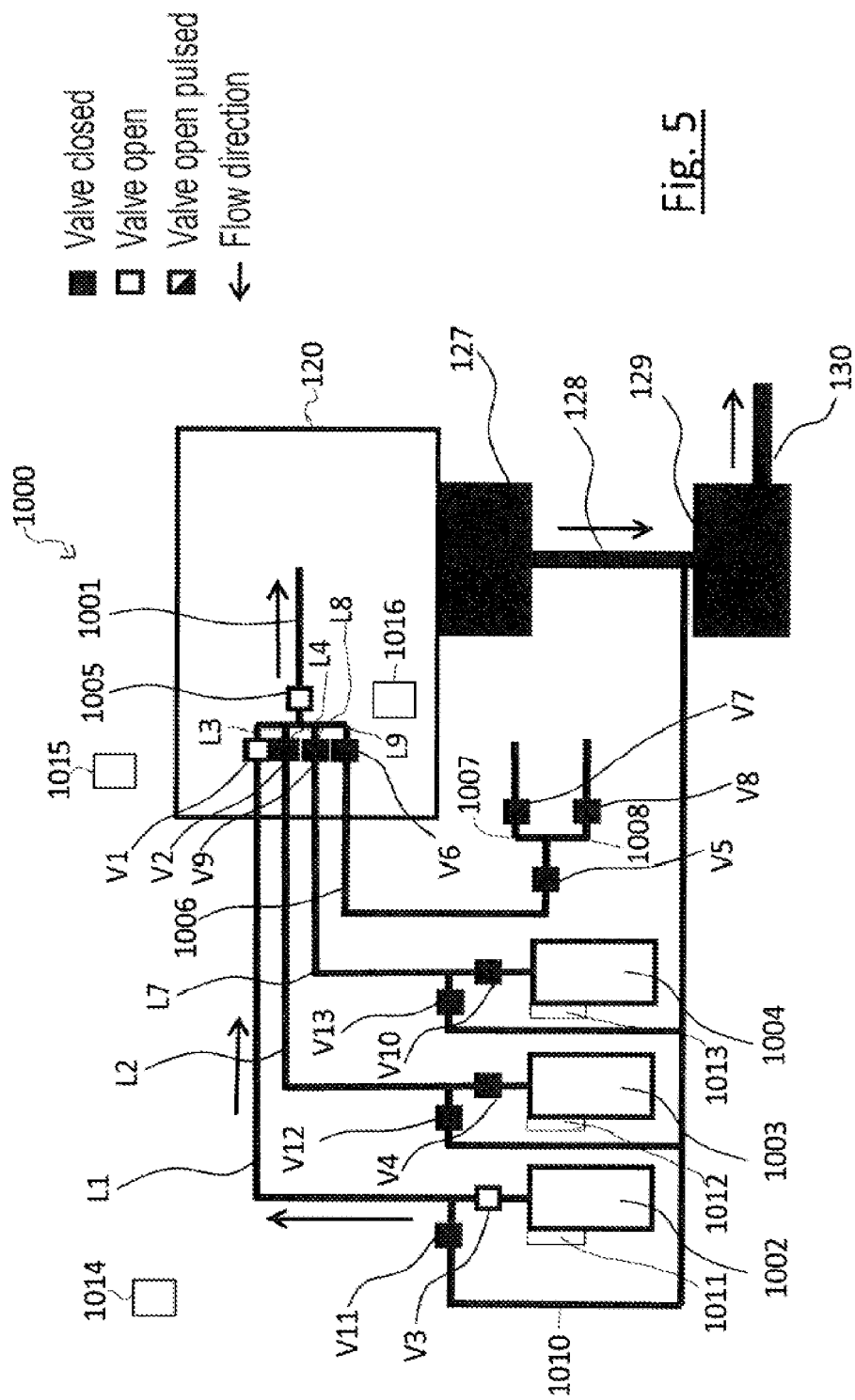
FIG. 5 shows a schematic illustration of a gas feed device in a first operating mode.

The embodiment of FIG. 5 is based on the embodiment of FIG. 4. Identical components are provided with identical reference signs. Reference is made to the explanations provided above, which also apply in this case. FIG. 5 shows the gas feed device 1000 in a first operating mode, namely in an individual gas mode, with an individual gaseous state of a precursor being guided to the surface of the object 125. With the operating mode illustrated in FIG. 5, the gaseous state of the first precursor is guided to the surface of the object 125. In the operating mode of FIG. 5, the third valve V3, the first valve V1 and the control valve 1005 are opened. All of the further valves are closed. The flow direction of the gaseous state of the first precursor is illustrated by arrows in FIG. 5. The flow of the precursor is set by the temperature of the first precursor reservoir 1002 using the first heating and/or cooling device 1011.

Figure 6:
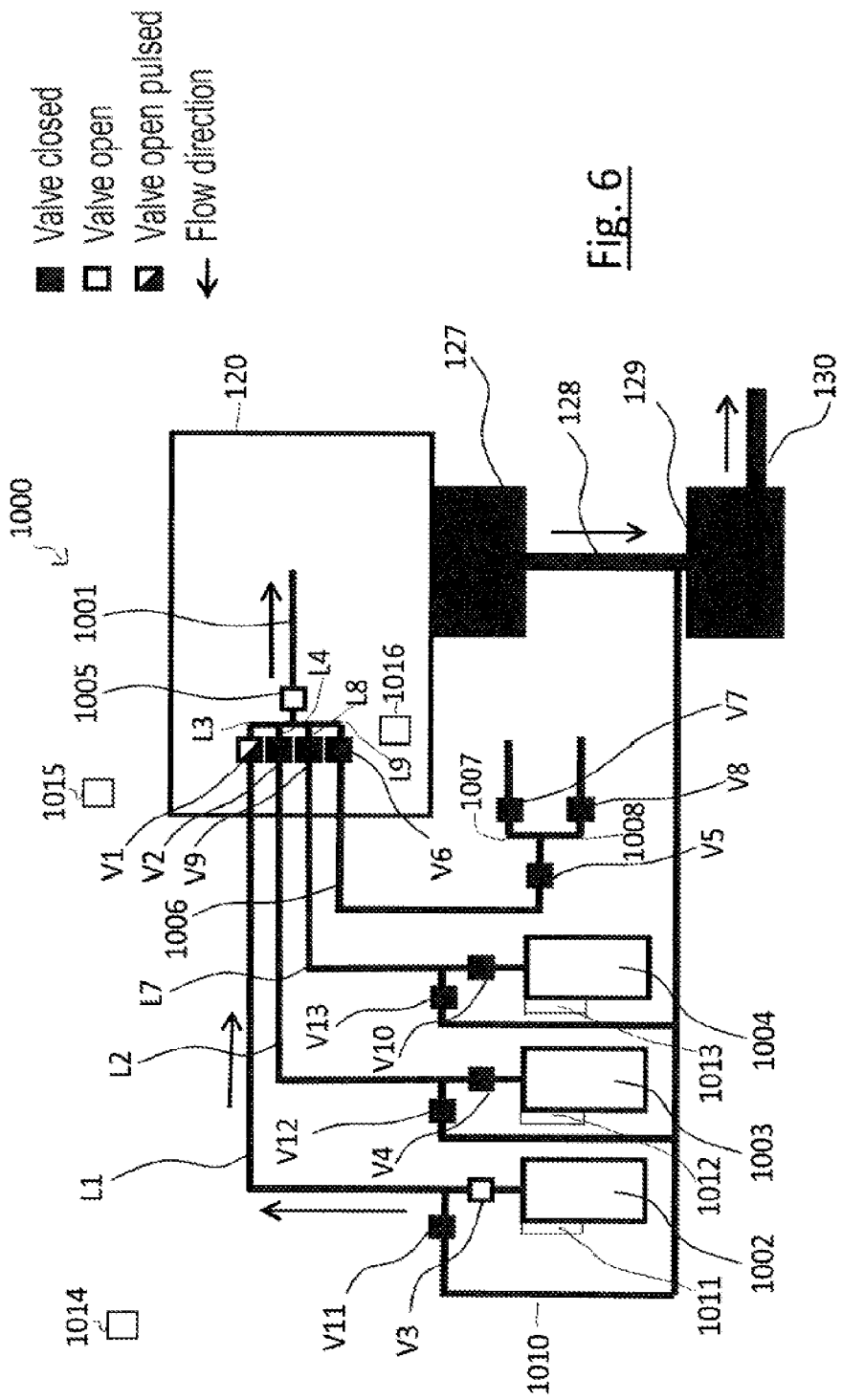
FIG. 6 shows a schematic illustration of a gas feed device in a second operating mode.

The embodiment of FIG. 6 is based on the embodiment of FIG. 4. Identical components are provided with identical reference signs. Reference is made to the explanations provided above, which also apply in this case. FIG. 6 shows the gas feed device 1000 in a second operating mode, namely in an individual gas mode, with an individual gaseous state of a precursor being guided to the surface of the object 125. With the operating mode illustrated in FIG. 6, the gaseous state of the first precursor is guided to the surface of the object 125. In the operating mode illustrated by FIG. 6, the third valve V3 and the control valve 1005 are opened. The first valve V1 is operated in pulsed fashion and is therefore opened or closed, depending on the pulse frequency. All of the further valves are closed. The flow direction of the gaseous state of the first precursor is illustrated by arrows in FIG. 6. The flow of the precursor is set by the pulse frequency and the pulse duration of the first valve V1. For example, the first valve V1 is activated by the control unit 123 and is correspondingly connected conductively or by radio to the control unit 123.

Figure 7:
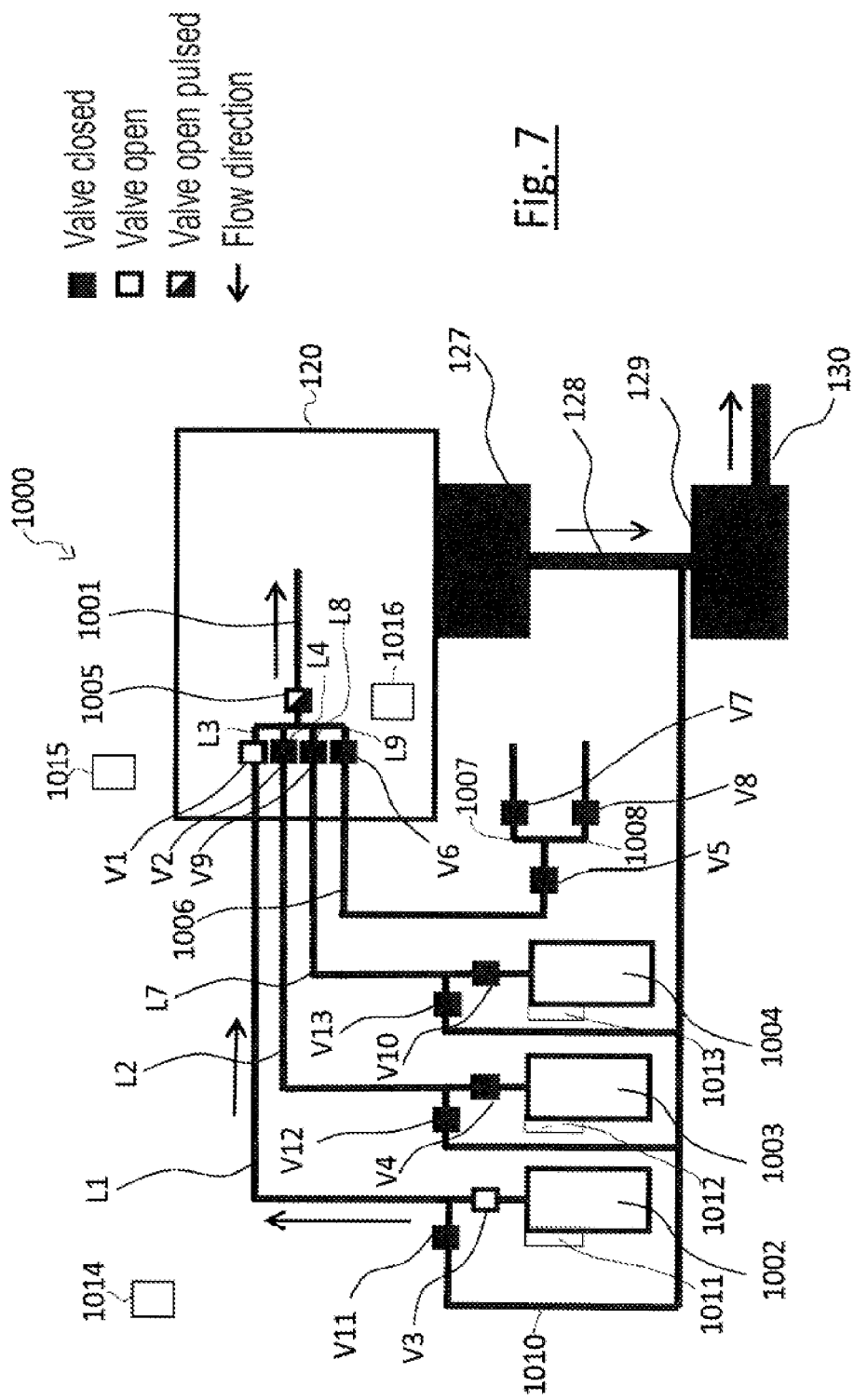
FIG. 7 shows a schematic illustration of a gas feed device in a third operating mode.

The embodiment of FIG. 7 is based on the embodiment of FIG. 4. Identical components are provided with identical reference signs. Reference is made to the explanations provided above, which also apply in this case. FIG. 7 shows the gas feed device 1000 in a third operating mode, namely in an individual gas mode, with an individual gaseous state of a precursor being guided to the surface of the object 125. With the operating mode illustrated in FIG. 7, the gaseous state of the first precursor is guided to the surface of the object 125. In the operating mode of FIG. 7, the third valve V3 and the first valve V1 are opened. The control valve 1005 is operated in pulsed fashion and is therefore opened or closed, depending on the pulse frequency. All of the further valves are closed. The flow direction of the gaseous state of the first precursor is illustrated by arrows in FIG. 7. The flow of the precursor is set by the pulse frequency and the pulse duration of the control valve 1005. For example, the control valve 1005 is activated by the control unit 123 and is correspondingly connected conductively or by radio to the control unit 123. The embodiment of FIG. 7 is advantageous since the control valve 1005 is particularly readily accessible. Should the control valve 1005 have to be exchanged, exchange is possible quite simply.

Figure 8:
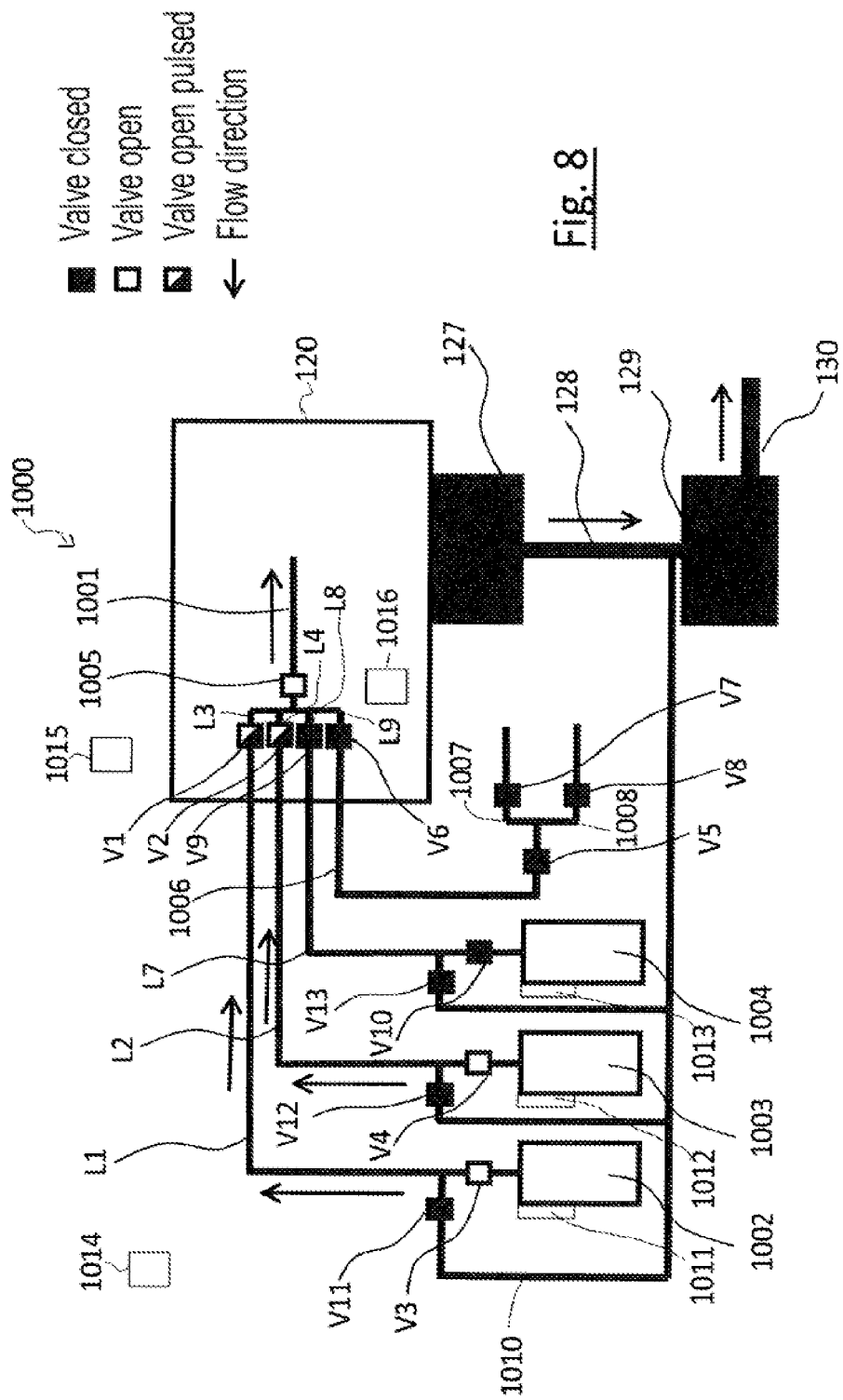
FIG. 8 shows a schematic illustration of a gas feed device in a fourth operating mode.
Figure 9:
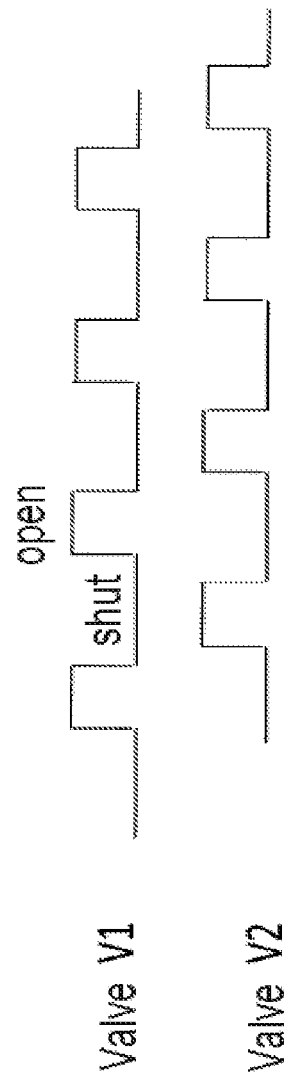
FIG. 9 shows a schematic illustration of a pulse activation of valves.

The embodiment of FIG. 8 is based on the embodiment of FIG. 4. Identical components are provided with identical reference signs. Reference is made to the explanations provided above, which also apply in this case. FIG. 8 shows the gas feed device 1000 in a fourth operating mode, namely in a gas mixing mode, in which the gaseous state of a first precursor and the gaseous state of a second precursor are alternatively guided onto the surface of the object 125. With the operating mode illustrated in FIG. 8, the gaseous state of the first precursor and the gaseous state of the second precursor are alternatively guided to the surface of the object 125. In the operating mode of FIG. 8, the third valve V3 and the fourth valve V4 are opened. Furthermore, the control valve 1005 is opened. The first valve V1 and the second valve V2 are operated in pulsed fashion and are therefore opened or closed, depending on the pulse frequency. All of the further valves are closed. The flow direction of the gaseous state of the first precursor and of the gaseous state of the second precursor is illustrated by arrows in FIG. 8. The flow of the individual precursors is set by the pulse frequency and the pulse duration of the first valve V1 and the second valve V2. For example, the first valve V1 and/or the second valve V2 is/are activated by the control unit 123 and is/are correspondingly connected conductively or by radio to the control unit 123. FIG. 9 shows the pulse activation of the first valve V1 and the second valve V2. If one of the two valves V1 and V2 is opened, the other of the two valves V1 and V2 is closed.

Figure 10:
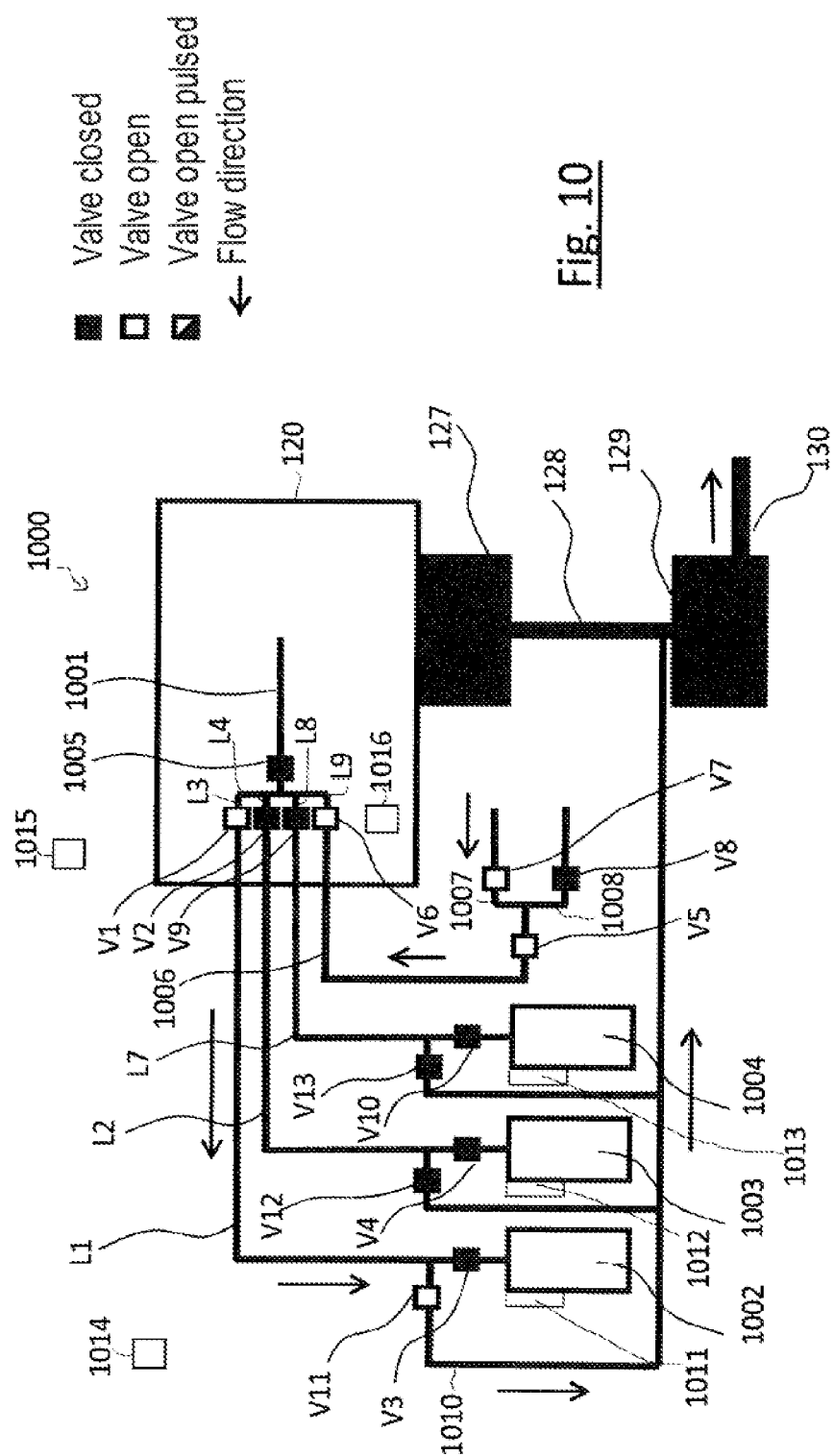
FIG. 10 shows a schematic illustration of a gas feed device in a fifth operating mode.

The embodiment of FIG. 10 is based on the embodiment of FIG. 4. Identical components are provided with identical reference signs. Reference is made to the explanations provided above, which also apply in this case. FIG. 10 shows the gas feed device 1000 in a fifth operating mode, namely in a cleaning mode, in which one or more lines of the gas feed device 1000 are rinsed and therefore cleaned. With the operating mode illustrated in FIG. 10, the first line device L1 is cleaned. In the operating mode of FIG. 10, the seventh valve V7, the fifth valve V5, the sixth valve V6, the first valve V1 and the eleventh valve V11 are opened. All of the further valves are closed, in particular the control valve 1005. As a result, the vacuum in the sample chamber 120 is not adversely affected. If further lines are cleaned, the corresponding valves are opened analogously to that which has been mentioned above. For example, cleaning gas in the form of nitrogen or oxygen is admitted through the seventh valve V7 and guided through the first line device L1. The flow direction of the cleaning gas is illustrated by arrows in FIG. 10. The flow of the cleaning gas is set by the fifth valve V5.

Figure 11:
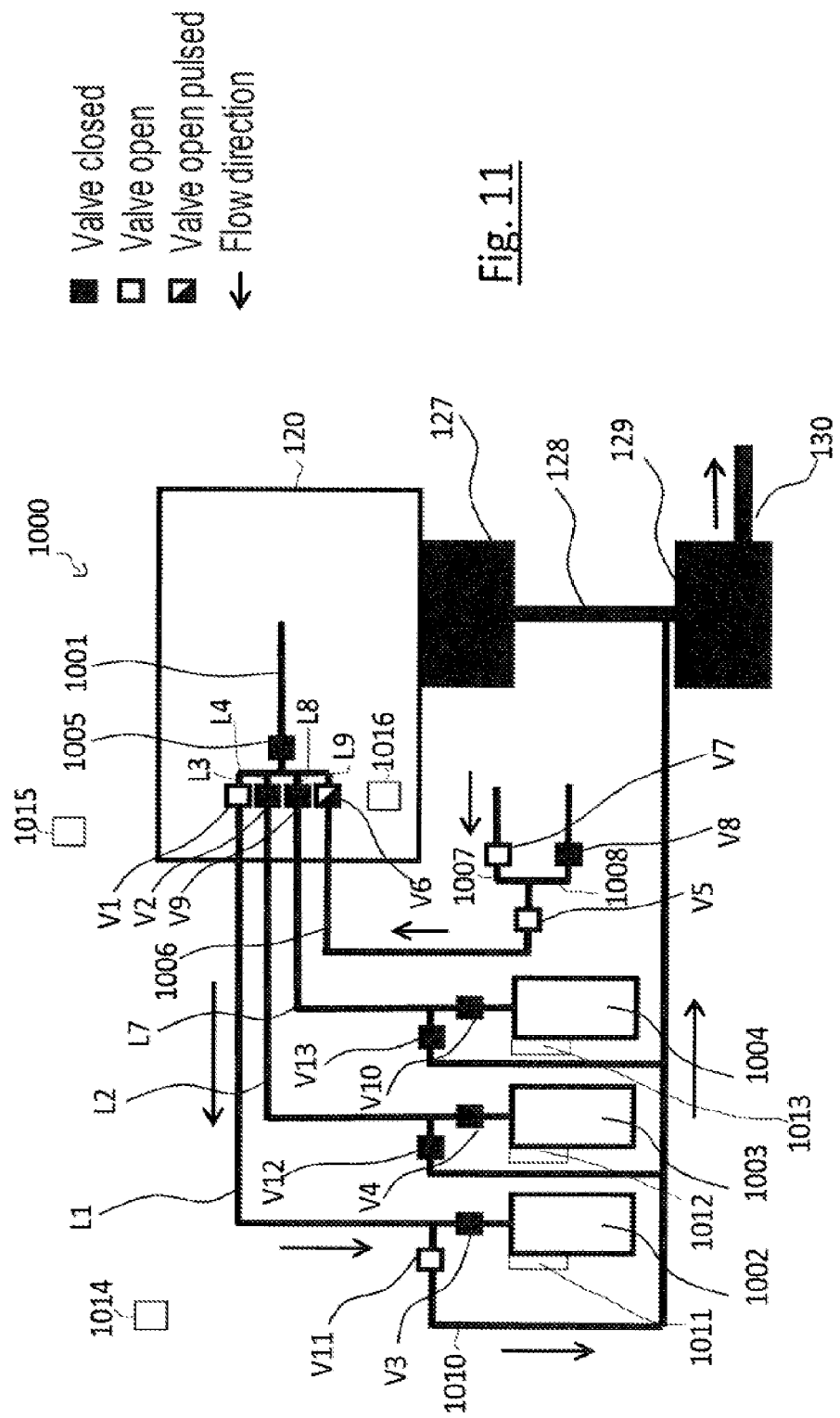
FIG. 11 shows a schematic illustration of a gas feed device in a sixth operating mode.

The embodiment of FIG. 11 is based on the embodiment of FIG. 4. Identical components are provided with identical reference signs. Reference is made to the explanations provided above, which also apply in this case. FIG. 11 shows the gas feed device 1000 in a sixth operating mode, namely in a cleaning mode, in which one or more lines of the gas feed device 1000 are rinsed and therefore cleaned. With the operating mode illustrated in FIG. 11, the first line device L1 is cleaned. In the operating mode of FIG. 11, the seventh valve V7, the fifth valve V5, the first valve V1 and the eleventh valve V11 are opened. The sixth valve V6 is operated in pulsed fashion and is therefore opened or closed, depending on the pulse frequency. All of the further valves are closed, in particular the control valve 1005. As a result, the vacuum in the sample chamber 120 is not adversely affected. If further lines are cleaned, the corresponding valves are opened analogously to that which has been mentioned above. For example, cleaning gas in the form of nitrogen or oxygen is admitted through the seventh valve V7 and guided through the first line device L1. The flow direction of the cleaning gas is illustrated by arrows in FIG. 11. The flow of the cleaning gas is set by the pulse frequency and the pulse duration of the sixth valve V6. For example, the sixth valve V6 is activated by the control unit 123 and is correspondingly connected conductively or by radio to the control unit 123.

Figure 12:
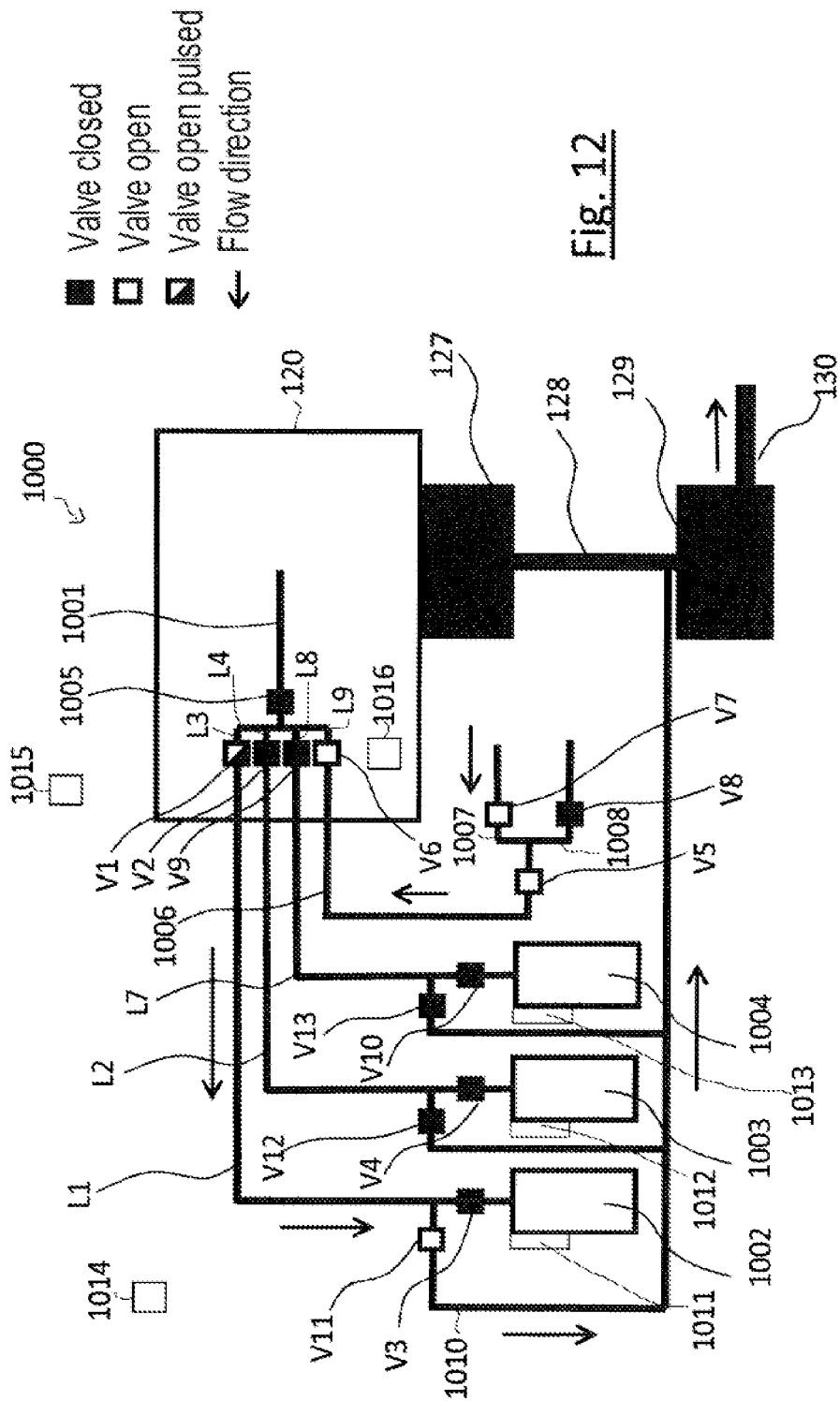
FIG. 12 shows a schematic illustration of a gas feed device in a seventh operating mode.

The embodiment of FIG. 12 is based on the embodiment of FIG. 4. Identical components are provided with identical reference signs. Reference is made to the explanations provided above, which also apply in this case. FIG. 12 shows the gas feed device 1000 in a seventh operating mode, namely in a cleaning mode, in which one or more lines of the gas feed device 1000 are rinsed and therefore cleaned. With the operating mode illustrated in FIG. 12, the first line device L1, by way of example, is cleaned. In the operating mode illustrated by FIG. 12, the seventh valve V7, the fifth valve V5, the sixth valve V6 and the eleventh valve V11 are opened. The first valve V1 is operated in pulsed fashion and is therefore opened or closed, depending on the pulse frequency. All of the further valves are closed, in particular the control valve 1005. As a result, the vacuum in the sample chamber 120 is not adversely affected. If further lines are cleaned, the corresponding valves are opened analogously to that which has been mentioned above. For example, cleaning gas in the form of nitrogen or oxygen is admitted through the seventh valve V7 and guided through the first line device L1. The flow direction of the cleaning gas is illustrated by arrows in FIG. 12. The flow of the cleaning gas is set by the pulse frequency and the pulse duration of the first valve V1. For example, the first valve V1 is activated by the control unit 123 and is correspondingly connected conductively or by radio to the control unit 123.

Figure 13:
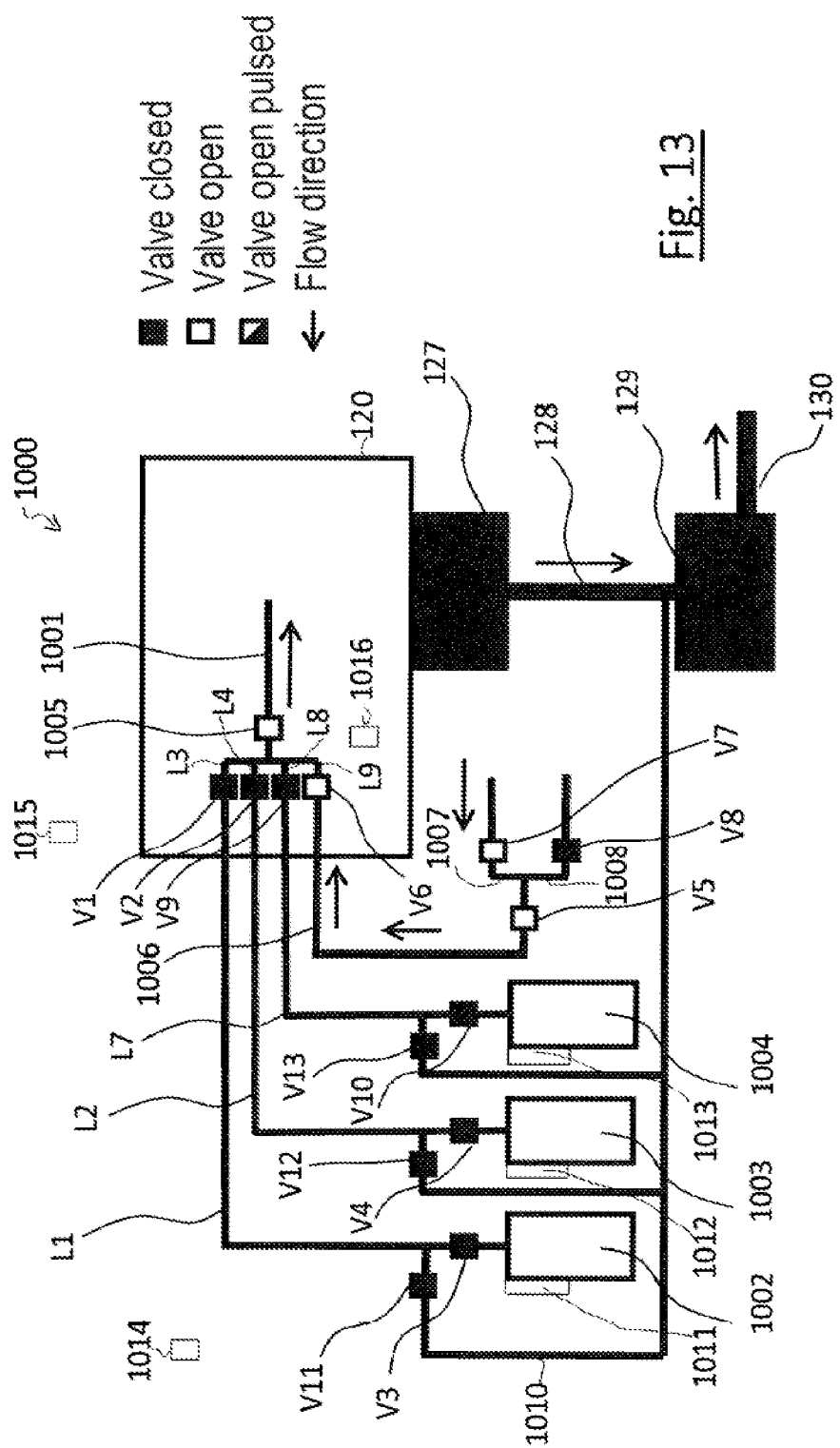
FIG. 13 shows a schematic illustration of a gas feed device in an eighth operating mode.

The embodiment of FIG. 13 is based on the embodiment of FIG. 4. Identical components are provided with identical reference signs. Reference is made to the explanations provided above, which also apply in this case. FIG. 13 shows the gas feed device 1000 in an eighth operating mode, namely in a cleaning mode, in which the feed unit 1001 is rinsed and therefore cleaned. In the operating mode illustrated by FIG. 13, the seventh valve V7, the fifth valve V5, the sixth valve V6 and the control valve 1005 are opened. All of the further valves are closed. For example, cleaning gas in the form of nitrogen or oxygen is admitted through the seventh valve V7 and guided through the feed unit 1001. The flow direction of the cleaning gas is illustrated by arrows in FIG. 13.

Figure 14:
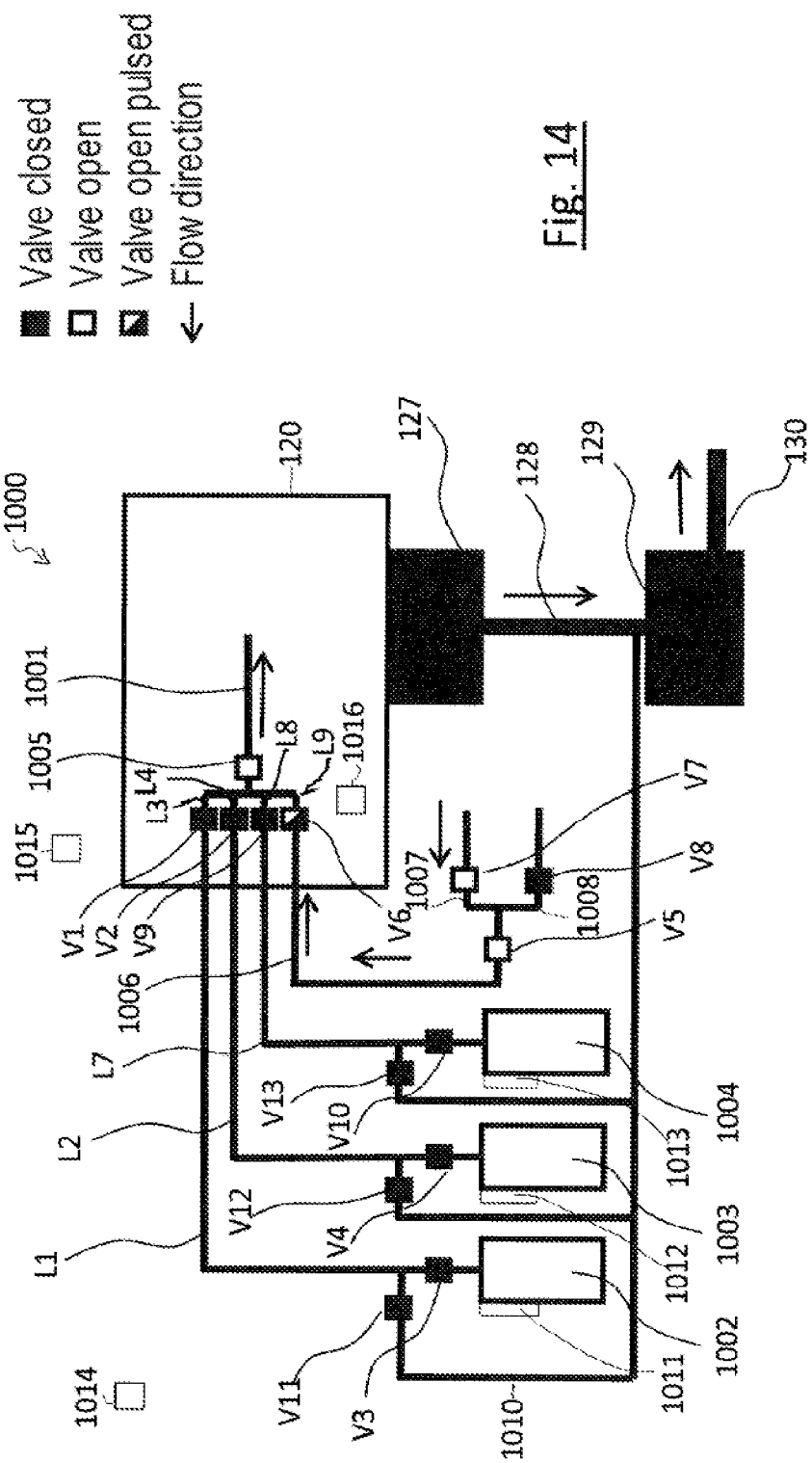
FIG. 14 shows a schematic illustration of a gas feed device in a ninth operating mode.

The embodiment of FIG. 14 is based on the embodiment of FIG. 4. Identical components are provided with identical reference signs. Reference is made to the explanations provided above, which also apply in this case. FIG. 14 shows the gas feed device 1000 in a ninth operating mode, namely in a cleaning mode, in which the feed unit 1001 is rinsed and therefore cleaned. In the operating mode of FIG. 14, the seventh valve V7, the fifth valve V5 and the control valve 1005 are opened. The sixth valve V6 is operated in pulsed fashion and is therefore opened or closed, depending on the pulse frequency. All of the further valves are closed. For example, cleaning gas in the form of nitrogen or oxygen is admitted through the seventh valve V7 and guided through the feed unit 1001. The flow direction of the cleaning gas is illustrated by arrows in FIG. 14. The flow of the cleaning gas is set by the pulse frequency and the pulse duration of the sixth valve V6. For example, the sixth valve V6 is activated by the control unit 123 and is correspondingly connected conductively or by radio to the control unit 123.

Figure 15:
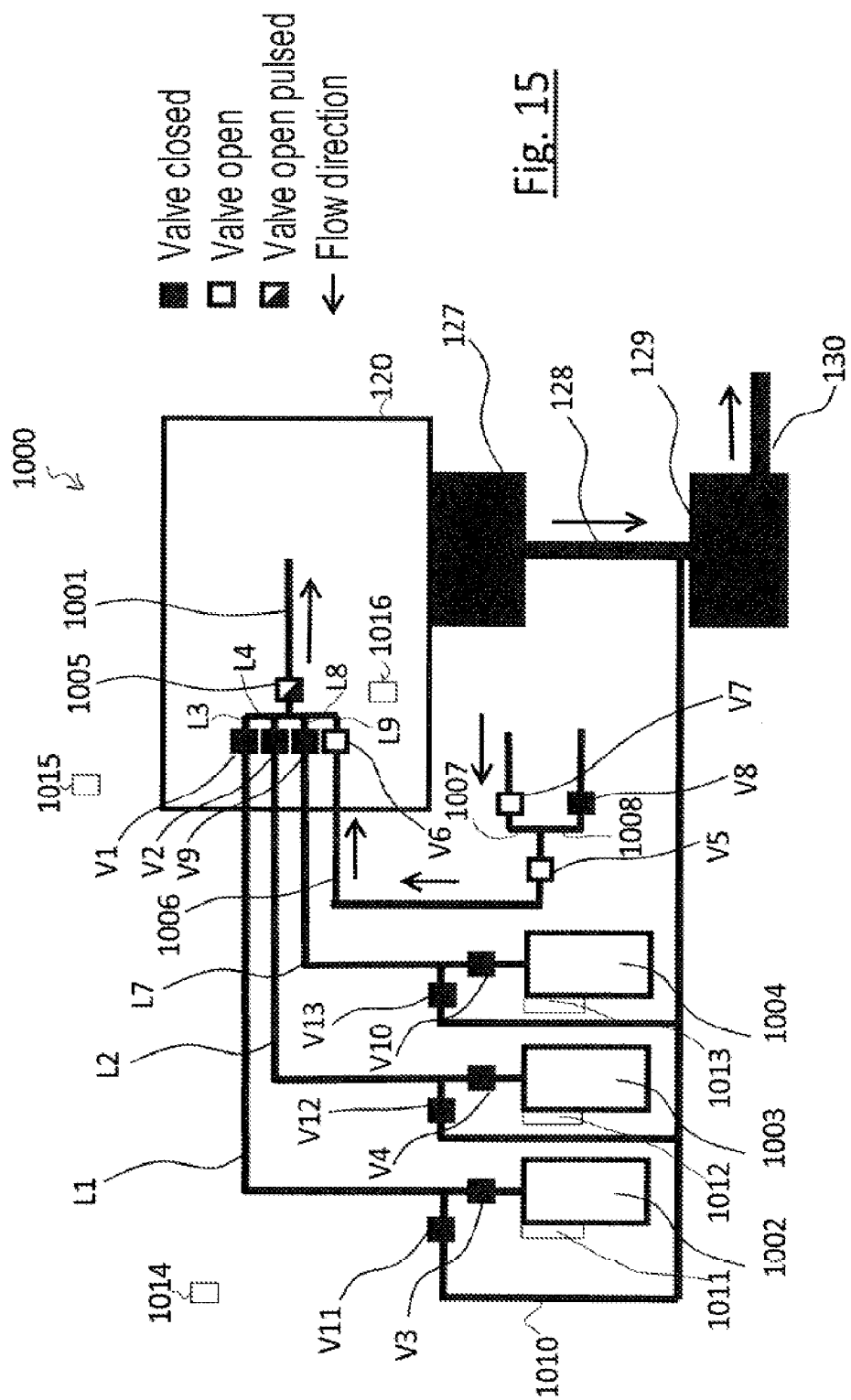
FIG. 15 shows a schematic illustration of a gas feed device in a tenth operating mode.

The embodiment of FIG. 15 is based on the embodiment of FIG. 4. Identical components are provided with identical reference signs. Reference is made to the explanations provided above, which also apply in this case. FIG. 15 shows the gas feed device 1000 in a tenth operating mode, namely in a cleaning mode, in which the feed unit 1001 is rinsed and therefore cleaned. In the operating mode illustrated by FIG. 15, the seventh valve V7, the fifth valve V5 and the sixth valve V6 are opened. The control valve 1005 is operated in pulsed fashion and is therefore opened or closed, depending on the pulse frequency. All of the further valves are closed. For example, cleaning gas in the form of nitrogen or oxygen is admitted through the seventh valve V7 and guided through the feed unit 1001. The flow direction of the cleaning gas is illustrated by arrows in FIG. 15. The flow of the cleaning gas is set by the pulse frequency and the pulse duration of the control valve 1005. For example, the control valve 1005 is activated by the control unit 123 and is correspondingly connected conductively or by radio to the control unit 123.

Figure 16:
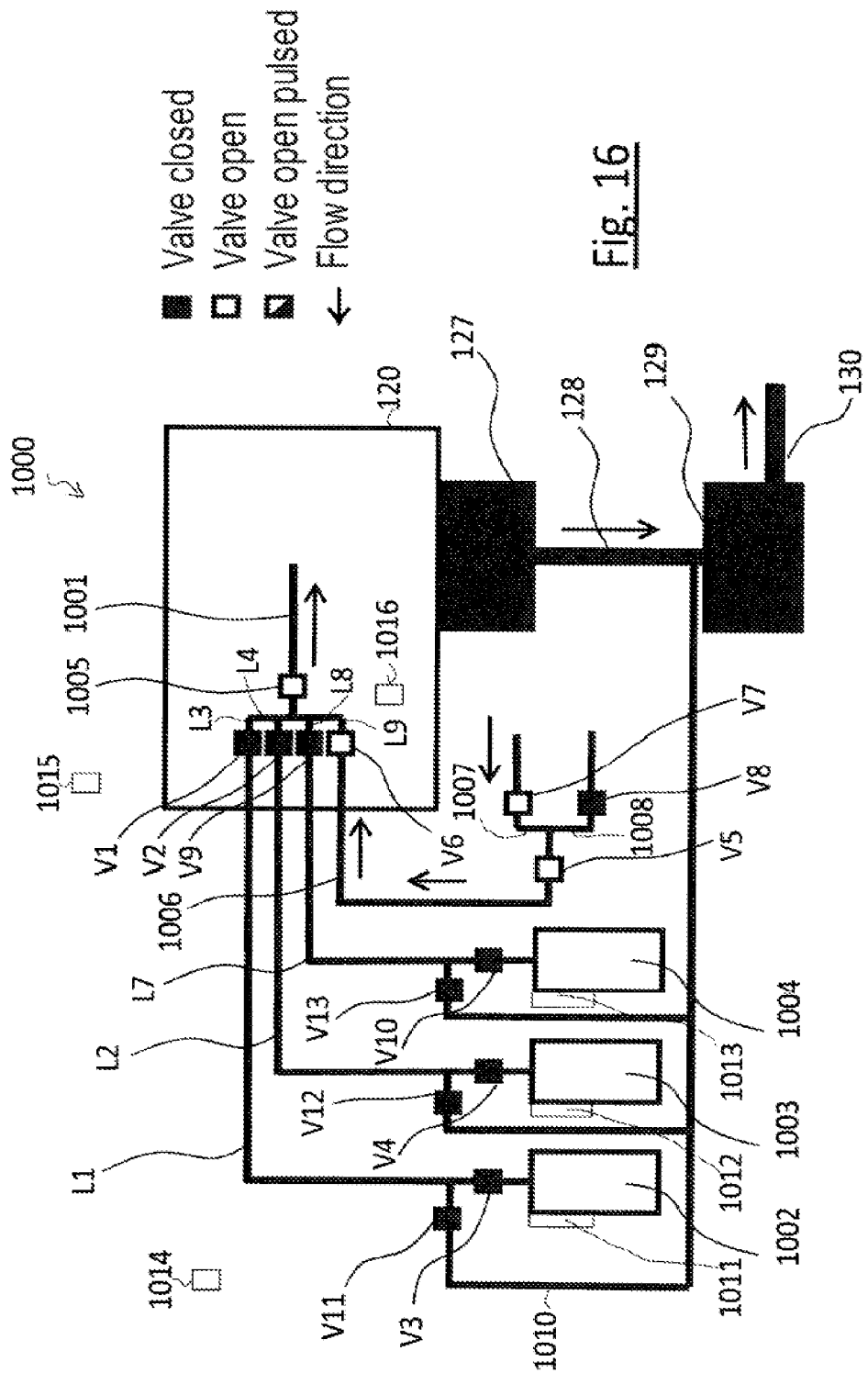
FIG. 16 shows a schematic illustration of a gas feed device in an eleventh operating mode.

The embodiment of FIG. 16 is based on the embodiment of FIG. 4. Identical components are provided with identical reference signs. Reference is made to the explanations provided above, which also apply in this case. FIG. 16 shows the gas feed device 1000 in an eleventh operating mode, namely in a mode for charge compensation. In the operating mode of FIG. 16, the seventh valve V7, the fifth valve V5, the sixth valve V6 and the control valve 1005 are opened. All of the further valves are closed. For example, nitrogen or oxygen is admitted as charge compensation gas through the seventh valve V7 and guided continuously through the feed unit 1001 onto the surface of the object 125. The flow direction of the charge compensation gas is illustrated by arrows in FIG. 16.

Figure 17:
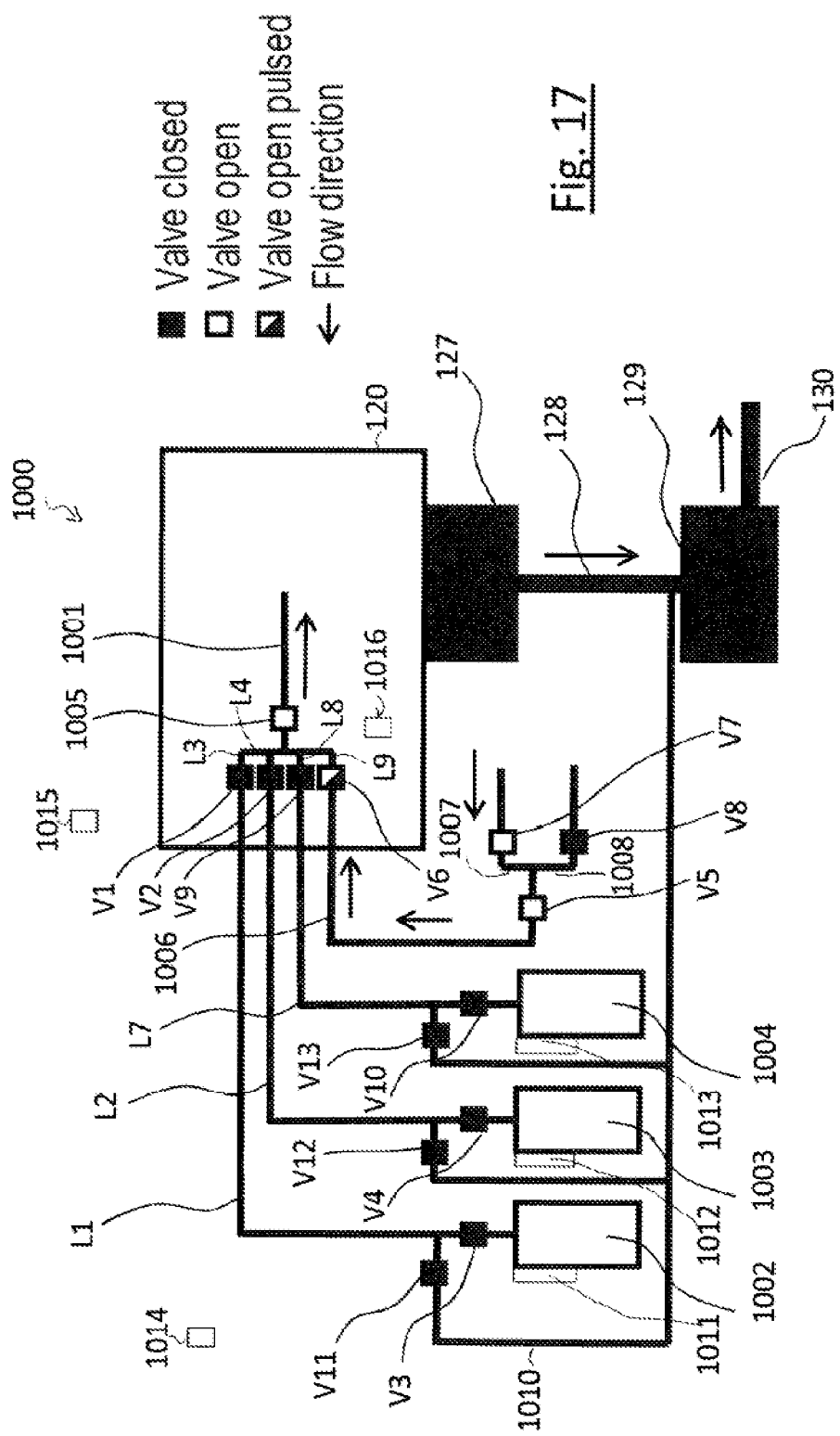
FIG. 17 shows a schematic illustration of a gas feed device in a twelfth operating mode.

The embodiment of FIG. 17 is based on the embodiment of FIG. 4. Identical components are provided with identical reference signs. Reference is made to the explanations provided above, which also apply in this case. FIG. 17 shows the gas feed device 1000 in a twelfth operating mode, namely in a mode for charge compensation. In the operating mode of FIG. 17, the seventh valve V7, the fifth valve V5 and the control valve 1005 are opened. The sixth valve V6 is operated in pulsed fashion and is therefore opened or closed, depending on the pulse frequency. All of the further valves are closed. For example, nitrogen or oxygen is admitted as charge compensation gas through the seventh valve V7 and guided through the feed unit 1001 onto the surface of the object 125. The flow direction of the charge compensation gas is illustrated by arrows in FIG. 17. The flow of the charge compensation gas is set by the pulse frequency and the pulse duration of the sixth valve V6. For example, the sixth valve V6 is activated by the control unit 123 and is correspondingly connected conductively or by radio to the control unit 123.

Figure 18:
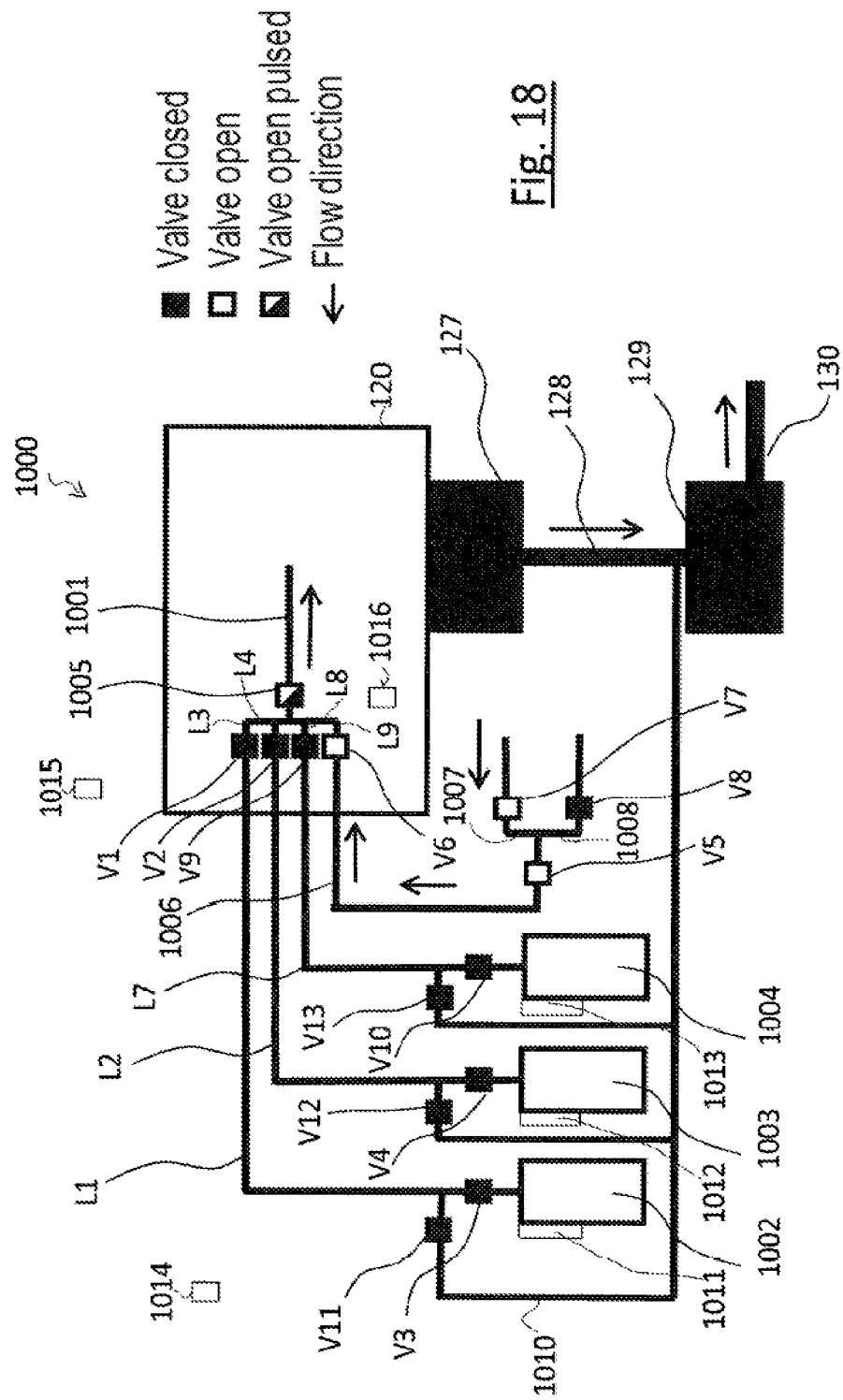
FIG. 18 shows a schematic illustration of a gas feed device in a thirteenth operating mode.

The embodiment of FIG. 18 is based on the embodiment of FIG. 4. Identical components are provided with identical reference signs. Reference is made to the explanations provided above, which also apply in this case. FIG. 18 shows the gas feed device 1000 in a thirteenth operating mode, namely in a mode for charge compensation. In the operating mode of FIG. 18, the seventh valve V7, the fifth valve V5 and the sixth valve V6 are opened. The control valve 1005 is operated in pulsed fashion and is therefore opened or closed, depending on the pulse frequency. All of the further valves are closed. For example, nitrogen or oxygen is admitted as charge compensation gas through the seventh valve V7 and guided through the feed unit 1001 onto the surface of the object 125. The flow direction of the charge compensation gas is illustrated by arrows in FIG. 18. The flow of the charge compensation gas is set by the pulse frequency and the pulse duration of the control valve 1005. For example, the control valve 1005 is activated by the control unit 123 and is correspondingly connected conductively or by radio to the control unit 123.

Figure 19:
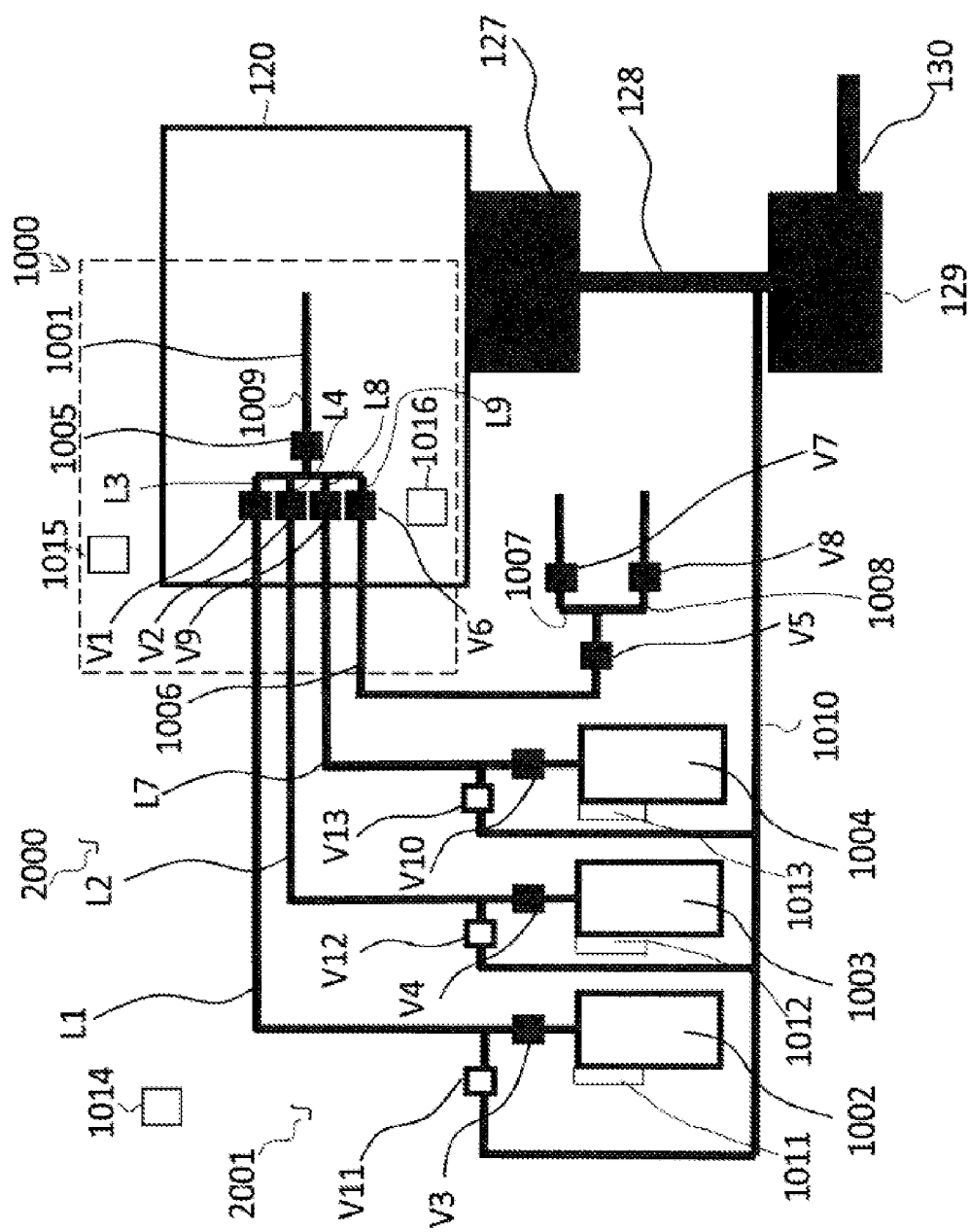
FIG. 19 shows a schematic illustration of a system with a gas feed device and a gas feed unit.

FIG. 19 shows a system 2000 which has a gas feed device 1000 (illustrated by dashed lines) and a gas feed unit 2001. The gas feed device 1000 according to the embodiment according of FIG. 19 has the first valve V1, the second valve V2, the ninth valve V9, the sixth valve V6, the third line device L3, the fourth line device L4, the eighth line device L8, the ninth line device L9, the control valve 1005, the line 1009 and the feed unit 1001. Furthermore, the gas feed device 1000 has parts of the first line device L1, of the second line device L2, of the seventh line device L7 and of the cleaning line 1006. All of the further features of the gas feed device 1000 that have been explained further above with regard to FIG. 4 are now arranged in the gas feed unit 2001, in particular the first precursor reservoir 1002, the second precursor reservoir 1003, the third precursor reservoir 1004 and parts of the first line device L1, of the second line device L2, of the seventh line device L7 and of the cleaning line 1006. Reference is therefore made to the statements made above with respect to FIG. 4, which also apply here.

The gas feed device 1000 is arranged at least partially or completely releasably on the gas feed unit 2001. For example, provision is made that the gas feed device 1000 has a fastening device for releasably fastening the gas feed device 1000 to the gas feed unit 2001. For releasably fastening, i.e., for releasably arranging, the gas feed device 1000 to or on the gas feed unit 2001, the fastening device has, for example, plug-in connecting devices which connect voltage lines and/or power lines to one another. The voltage lines and/or power lines are used, for example, for operating the fourth heating and/or cooling device 1015 and the heating and/or cooling unit 1016. Furthermore, provision is additionally or alternatively made for the first line device L1, the second line device L2, the seventh line device L7 and/or the cleaning line 1006 to be embodied as a plug-in connection.

Using plug-in connections, the first line device L1 has, for example, a first plug-in unit and a second plug-in unit which is connectable to the first plug-in unit. The first plug-in unit is arranged, for example, on the gas feed device 1000. By contrast, the second plug-in unit is arranged, for example, on the gas feed unit 2001. For example, the first plug-in unit is inserted into the second plug-in unit. In particular, provision is made for the first plug-in unit and/or the second plug-in unit to be provided with at least one sealing unit on an outer side and/or an inner side such that the first plug-in unit lies sealingly against the second plug-in unit. The second line device L2, the seventh line device L7 and the cleaning line 1006 each likewise correspondingly have first plug-in units and second plug-in units which are designed as described for the plug-in units of the first line device L1.

Figure 20:
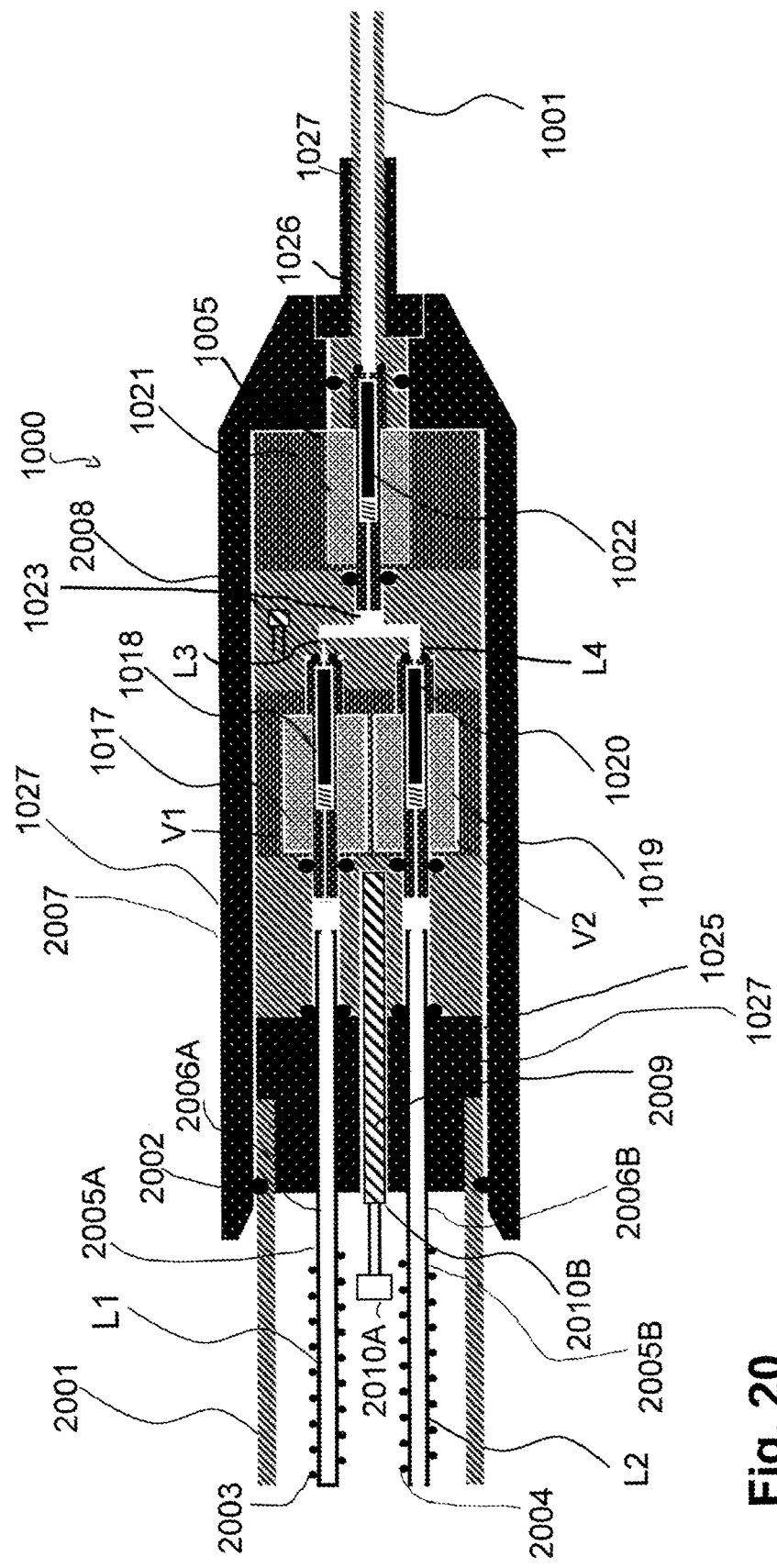
FIG. 20 shows a schematic illustration of a gas feed unit of the system according to FIG. 18.

FIG. 20 shows the gas feed device 1000 according to FIG. 19 in a schematic illustration. Identical component parts are provided with identical reference signs. The gas feed device 1000 is arranged at the gas feed unit 2001 by plugging the gas feed device 1000 onto a tubular element of the gas feed unit 2001 so that the gas feed unit 2001 has at least one seal 2002 on an outer side of the gas feed unit 2001. The gas feed device 1000 and the gas feed unit 2001 rest sealingly on each other when the gas feed device 1000 is arranged at the tubular element of the gas feed unit 2001.

The first line device L1, the second line device L2, the seventh line device L7 and the cleaning line 1006 run in the tubular element of the gas feed unit 2001. For better clarity, only the first line device L1 and the second line device L2 are illustrated in FIG. 20. Explanations below with respect to the first line device L1 and the second line device L2 also apply analogously, for example, to the seventh line device L7 and/or to the cleaning line 1006.

A first heating and/or cooling element 2003 is arranged at the first line device L1. For example, the heating and/or cooling element 2003 is embodied as a heating wire which is wound around the first line device L1. Furthermore, a second heating and/or cooling element 2004 is arranged at the second line device L2. For example, the heating and/or cooling element 2004 is embodied as a heating wire which is wound around the second line device L2. In a further embodiment, provision is made that a single heating and/or cooling element is arranged both on the first line device L1 and on the second line device L2.

The first line device L1 has a first plug-in unit 2005A and a second plug-in unit 2006A which is connectable to the first plug-in unit 2005A. In the embodiment of FIG. 20, the first plug-in unit 2005A is arranged at the gas feed unit 2001. By contrast, the second plug-in unit 2006A is arranged, for example, at the gas feed device 1000. In particular, the first plug-in unit 2005A is inserted into the second plug-in unit 2006A. For example, provision is made for the first plug-in unit 2005A and/or the second plug-in unit 2006A to be provided with at least one sealing unit on an outer side and/or an inner side such that the first plug-in unit 2005A lies sealingly against the second plug-in unit 2006A.

The second line device L2 has a first plug-in unit 2005B and a second plug-in unit 2006B which is connectable to the first plug-in unit 2005B. In the embodiment of FIG. 20, the first plug-in unit 2005B is arranged at the gas feed unit 2001. By contrast, the second plug-in unit 2006B is arranged, for example, at the gas feed device 1000. For example, the first plug-in unit 2005B is inserted into the second plug-in unit 2006B. In particular, provision is made for the first plug-in unit 2005B and/or the second plug-in unit 2006B to be provided with at least one sealing unit on an outer side and/or an inner side such that the first plug-in unit 2005B lies sealingly against the second plug-in unit 2006B.

The gas feed device 1000 according to FIG. 20 has the fourth heating and/or cooling device 1015, explained above. The fourth heating and/or cooling device 1015 has a temperature sensor 2008 and a third heating and/or cooling element 2009. Both the temperature sensor 2008 and the third heating and/or cooling element 2009 are arranged in a main body 2007 of the gas feed device 1000. The temperature sensor 2008 is embodied, for example, as a semiconductor temperature sensor. However, the invention is not restricted to the use of such temperature sensors. On the contrary, any temperature sensor which is suitable for the invention can be used as the temperature sensor. For example, the third heating and/or cooling element 2009 is embodied as a heating wire. However, the invention is not restricted to the use of a heating wire. On the contrary, any heating and/or cooling element which is suitable for the invention can be used for the third heating and/or cooling element 2009.

The third heating and/or cooling element 2009 has a first plug-in connecting device 2010A and a second plug-in connecting device 2010B. In the embodiment of FIG. 20, the first plug-in connecting device 2010A is arranged at the gas feed unit 2001. By contrast, the second plug-in connecting device 2010B is arranged at the gas feed device 1000. For example, the first plug-in connecting device 2010A is inserted into the second plug-in connecting device 2010B. The first plug-in connecting device 2010A and the second plug-in connecting device 2010B connect voltage lines and/or power lines to one another. The voltage lines and/or power lines are used, for example, for operating the fourth heating and/or cooling device 1015 and the heating and/or cooling unit 1016. Further use options are described further below.

As illustrated above, the gas feed device 1000 has the first valve V1, the second valve V2 and the control valve 1005. In the embodiment of FIG. 20, the first valve V1, the second valve V2 and the control valve 1005 are each embodied as a magnetic valve.

The first valve V1 is embodied as a 2-part solenoid valve. A first part of the solenoid valve is formed by a first coil 1017. A second part of the solenoid valve is formed by a movable first valve body 1018. The movable first valve body 1018 is enclosed by the first coil 1017. If the first coil 1017 of the solenoid valve is energized, the first valve body 1018 is moved into an opening position and releases a flow path for the gaseous state of the first precursor between an inlet of the solenoid valve and an outlet of the solenoid valve. In the event that the first coil 1017 is not energized, the first valve body 1018 is brought into a closure position in which the flow path for the gaseous state of the first precursor is closed.

The second valve V2 is likewise embodied as a 2-part solenoid valve. A first part of the solenoid valve is formed by a second coil 1019. A second part of the solenoid valve is formed by a movable second valve body 1020. The movable second valve body 1020 is enclosed by the second coil 1019. If the second coil 1019 of the solenoid valve is energized, the second valve body 1020 is moved into an opening position and releases a flow path for the gaseous state of the second precursor between an inlet of the solenoid valve and an outlet of the solenoid valve. In the event that the second coil 1019 is not energized, the second valve body 1020 is brought into a closure position in which the flow path for the gaseous state of the second precursor is closed.

The control valve 1005 is likewise embodied as a 2-part solenoid valve. A first part of the solenoid valve is formed by a third coil 1021. A second part of the solenoid valve is formed by a movable third valve body 1022. The movable third valve body 1022 is enclosed by the third coil 1021. If the third coil 1021 of the solenoid valve is energized, the third valve body 1022 is moved into an opening position and releases a flow path for the gaseous state of the first precursor or of the second precursor between an inlet of the solenoid valve and an outlet of the solenoid valve. In the event that the third coil 1021 is not energized, the third valve body 1022 is brought into a closure position in which the flow path for the gaseous state of the first precursor or of the second precursor is closed.

The first coil 1017 of the first valve V1, the second coil 1019 of the second valve V2 and/or the third coil 1021 of the control valve 1005 are energized, for example, by the voltage lines and/or power lines which are provided by the first plug-in connecting device 2010A and the second plug-in connecting device 2010B.

For example, provision is made that at least one of the above-mentioned magnetic valves is embodied as a micro-valve. With regard to the micro-valve, reference is made to the statements further above, which also apply here.

The gas feed device 1000 has at least one of the following features:
(i) the first valve V1 is embodied as a pulsed magnetic valve;
(ii) the second valve V2 is embodied as a pulsed magnetic valve;
(iii) the ninth valve V9 is embodied as a pulsed magnetic valve;
(iv) the sixth valve V6 is embodied as a pulsed magnetic valve; and
(v) the control valve 1005 is embodied as a pulsed magnetic valve.

As stated above, a pulsed magnetic valve is understood as meaning a valve which is activated with a pulse frequency and can be brought alternatively into a closed state (closure position) and into an open state (opening position) in accordance with the pulse frequency. For example, the pulse frequency lies in the range from 5 Hz to 50 Hz or in the range from 10 Hz to 30 Hz, with the range limits being included in the aforementioned ranges. In particular, the pulse frequency is 10 Hz.

The third line device L3 and the fourth line device L4 have a common connecting portion 1023 which is connected to the control valve 1005. In other words, the third line device L3 and the fourth line device L4 lead into the common connecting portion 1023. The connecting portion 1023 is then likewise connected to the control valve 1005. A first end of the common connecting portion 1023 is connected to the third line device L3 and to the fourth line device L4. Furthermore, a second end of the common connecting portion 1023 is connected to the control valve 1005.

In a further embodiment of the gas feed device 1000, provision is additionally or alternatively made for the gas feed device 1000 to have a first portion and a second portion. The first line device L1, the second line device L2, the seventh line device L7 and the cleaning line 1006 are arranged in the first portion. By contrast, the first valve V1, the second valve V2, the ninth valve V9, the sixth valve V6 and the control valve 1005 are arranged in the second portion. In the further embodiment of the gas feed device 1000 according to the system described herein, provision is made for the first portion to be arranged releasably on the second portion. In other words, the gas feed device 1000 is formed in at least 2 parts. The first part is formed by the first portion and the second part is formed by the second portion. Also in the further embodiment, for the releasable arrangement of the first portion on the second portion, the first portion and/or the second portion have/has, for example, plug-in connecting devices which connect voltage lines and/or power lines to one another. Furthermore, provision is additionally or alternatively made for the first line device L1 and/or the second line device L2 to be embodied as a plug-in connection where the first line device L1 has, for example, a first plug-in unit which is connectable to a second plug-in unit which is arranged at the first valve V1. Furthermore, provision is made, for example, for the second line device L2 to have, for example, a third plug-in unit which is connectable to a fourth plug-in unit which is arranged at the second valve V2. In particular, provision is made for the first plug-in unit, the second plug-in unit, the third plug-in unit and/or the fourth plug-in unit to be provided with at least one sealing unit on an outer side and/or an inner side such that the plug-in units which are connected to one another lie sealingly on one another. The above also applies analogously to the seventh line device L7 and to the cleaning line 1006.

Figure 21:
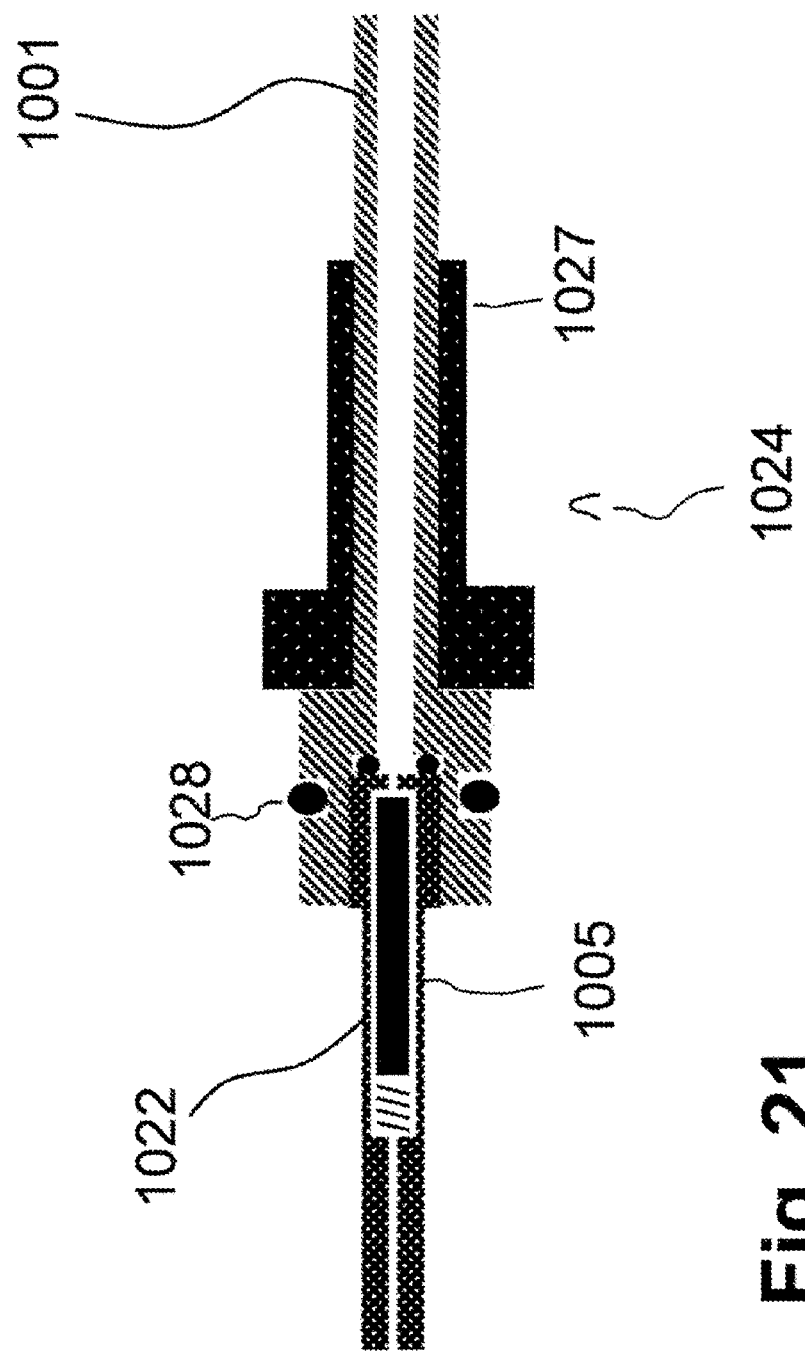
FIG. 21 shows a schematic illustration of a movable unit with a control valve and a feed unit.

In the embodiment illustrated in FIG. 20 the control valve 1005 and the feed unit 1001 form a movable unit 1024. The movable unit 1024 is arranged releasably in and/or at the gas feed device 1000. The movable unit 1024 is illustrated in FIG. 21. In other words, the movable unit 1024, which has the control valve 1005 and the feed unit 1001, can be released from the gas feed device 1000 and fastened to the gas feed device 1000. A sealing unit 1028 is arranged at the outer side of the movable unit 1024. As illustrated above, the control valve 1005 has a movable third valve body 1022 and a third coil 1021. The movable third valve body 1022 is enclosed by the third coil 1021. In a further embodiment of the gas feed device 1000, only the movable third valve body 1022 with the feed unit 1001 forms the movable unit 1024.

The first valve V1 and the second valve V2 can be designed, for example, basically in the same way as the movable unit 1024, but then without the feed unit 1001.

To shield electromagnetic fields of the first coil 1017, the second coil 1019 and the third coil 1021, a shield 1027 is arranged in each case both at a first end portion 1025 and at a second end portion 1026 of the main body 2007 of the gas feed device 1000. Moreover, the basic body 2007 is provided with a shield 1027 over an entire outer surface of the basic body 2007 or substantially over the entire outer surface of the basic body 2007. The shields 1027 are formed for example as µ-metal.

Should it be necessary for any reason to exchange one of the above-mentioned valves, in particular the first valve V1, the second valve V2 and/or the control valve 1005, then the exchange can be undertaken, for example, as follows:

- on the one hand, the entire gas feed device 1000 is separated from the gas feed unit 2001. Subsequently, the valve to be exchanged of the gas feed device 1000 can be exchanged. The gas feed device 1000 is then arranged again on the gas feed unit 2001.
- If the gas feed device 1000 has two portions, the first portion is separated from the second portion. Subsequently, the valve to be exchanged can be exchanged. The first portion is then connected again to the second portion.
- On the other hand, the control valve 1005 can be exchanged in a simple manner. Either the movable unit 1024 is pulled out of the main body 2007 and a further movable unit 1024 is inserted again into the main body 2007. Alternatively thereto, the movable third valve body 1022 and the feed unit 1001 are removed and another movable third valve body 1022 together with the feed unit 1001 or another feed unit 1001 is again installed in the main body 2007.

Magnetic valves are exchangeable in a simple manner in comparison to the prior art. At least parts of the magnetic valves are exchangeable in a simple manner. For example, the body of a solenoid valve is pulled out of the coil of the solenoid valve so that an electrical connection does not necessarily need to be separated.

Figure 22:
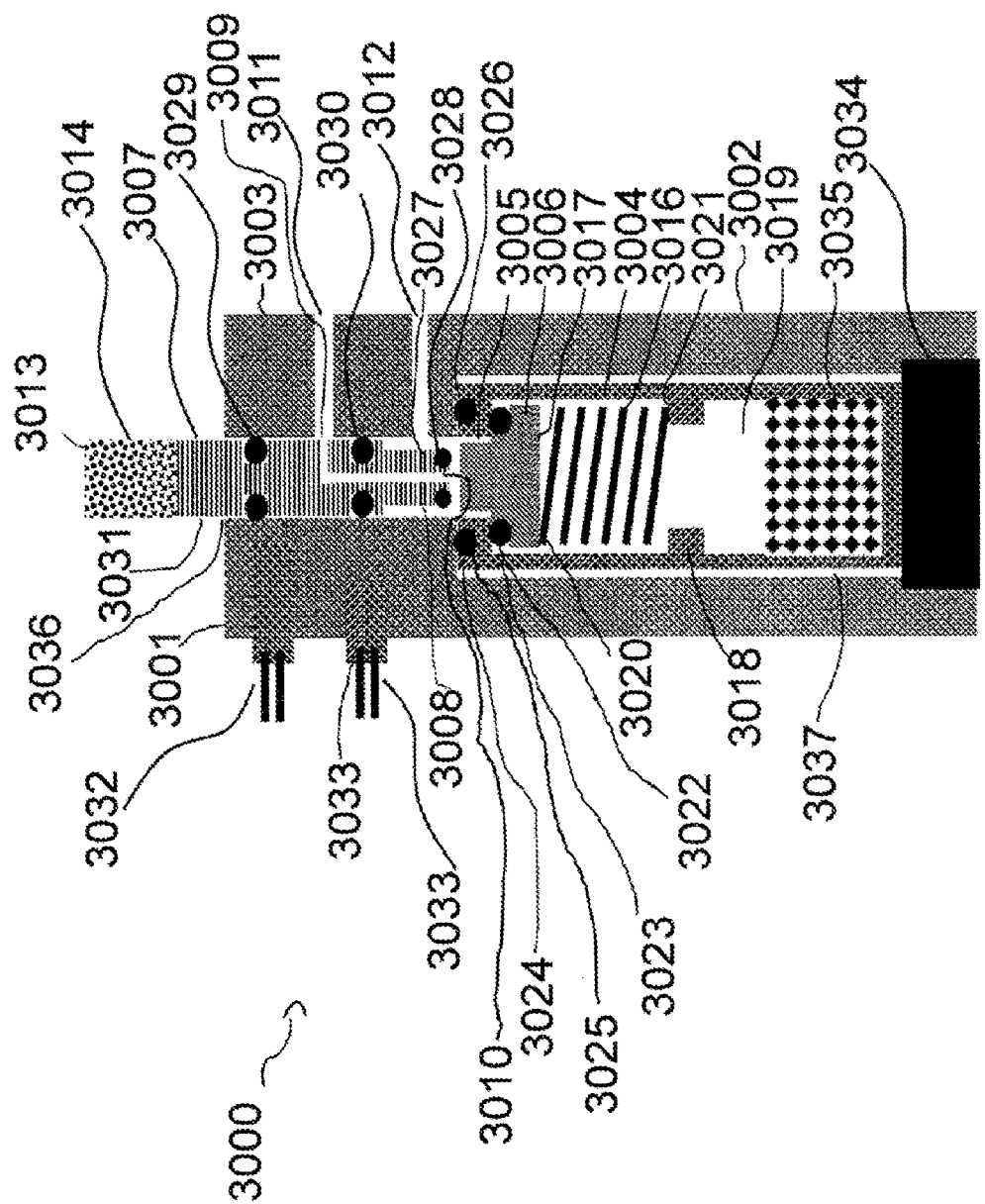
FIG. 22 shows a first schematic illustration of a gas reservoir.

FIG. 22 shows a gas reservoir 3000 which is used, for example, in the system described herein. In particular, the first precursor reservoir 1002, the second precursor reservoir 1003 and/or the third precursor reservoir 1004 is/are designed in the same manner as the gas reservoir 3000.

The gas reservoir 3000 has a basic body 3001, the basic body 3001 being provided with a first receiving unit 3002 and with a second receiving unit 3003. The first receiving unit 3002 is arranged at the second receiving unit 3003. The first receiving unit 3002 has a first interior 3037. The second receiving unit 3003 has a second interior 3036.

A gas-receiving unit 3004 is arranged in the first interior 3037 of the first receiving unit 3002 of the basic body 3001. For example, a precursor 3035 is arranged in the gas-receiving unit 3004. The precursor 3035 is arranged, for example, in the solid state or in the liquid state in the gas-receiving unit 3004. The solid state or the liquid state of the precursor 3035 is in equilibrium with the gaseous state of the precursor 3035. The individual atoms and molecules of the gaseous state of the precursor 3035 determine the vapour pressure of the precursor 3035. If the gas reservoir 3000 is opened by opening of a valve of the gas reservoir 3000, the gaseous state of the precursor 3035 is let out of the gas reservoir 3000.

Moreover, the gas-receiving unit 3004 has a gas outlet opening 3005 and a movable closure unit 3006 for opening or closing the gas outlet opening 3005 of the gas-receiving unit 3004.

The gas reservoir 3000 has a sliding unit 3007 which is arranged movably in the second interior 3036 of the second receiving unit 3003 of the basic body 3001. The sliding unit 3007 is provided with a sliding-unit line device 3008. The sliding-unit line device 3008 is designed to move the movable closure unit 3006. The sliding-unit line device 3008 is provided with a first opening 3009 and a second opening 3010. By contrast, the basic body 3001 has a first basic body opening 3011 and a second basic body opening 3012. The first basic body opening 3011 is connectable to a pump unit, for example to the first pump 127. The second basic body opening 3012 is connectable to a line device for the feed of the gas to the object 125. For example, the line device is embodied as the first line device L1, as the second line device L2 or as the seventh line device L7.

The sliding unit 3007 can be brought into a first position and into a second position. The sliding unit 3007 is moved with an actuator 3013 linearly along a longitudinal axis of the basic body 3001 in the second interior 3036. An insulator 3014 is arranged between the actuator 3013 and the sliding unit 3007. For example, the actuator 3013 is embodied as a linear motor. However, the invention is not restricted to a linear motor. On the contrary, any actuator which is suitable for the invention can be used as the actuator 3013.

In the first position of the sliding unit 3007, both the first opening 3009 of the sliding-unit line device 3008 is fluidically connected to the first basic body opening 3011 and the second opening 3010 of the sliding-unit line device 3008 is fluidically connected to the second basic body opening 3012. Accordingly, the first basic body opening 3011 and the second basic body opening 3012 are also fluidically connected. In the first position of the sliding unit 3007, the first opening 3009 of the sliding-unit line device 3008 is arranged at the first basic body opening 3011. The closure unit 3006 closes the gas outlet opening 3005 of the gas-receiving unit 3004. It is therefore possible in the first position of the sliding unit 3007 to evacuate the line device for the supply of the gas to the object 125 using the pump unit. FIG. 22 shows the sliding unit 3007 in the first position.

Figure 23:
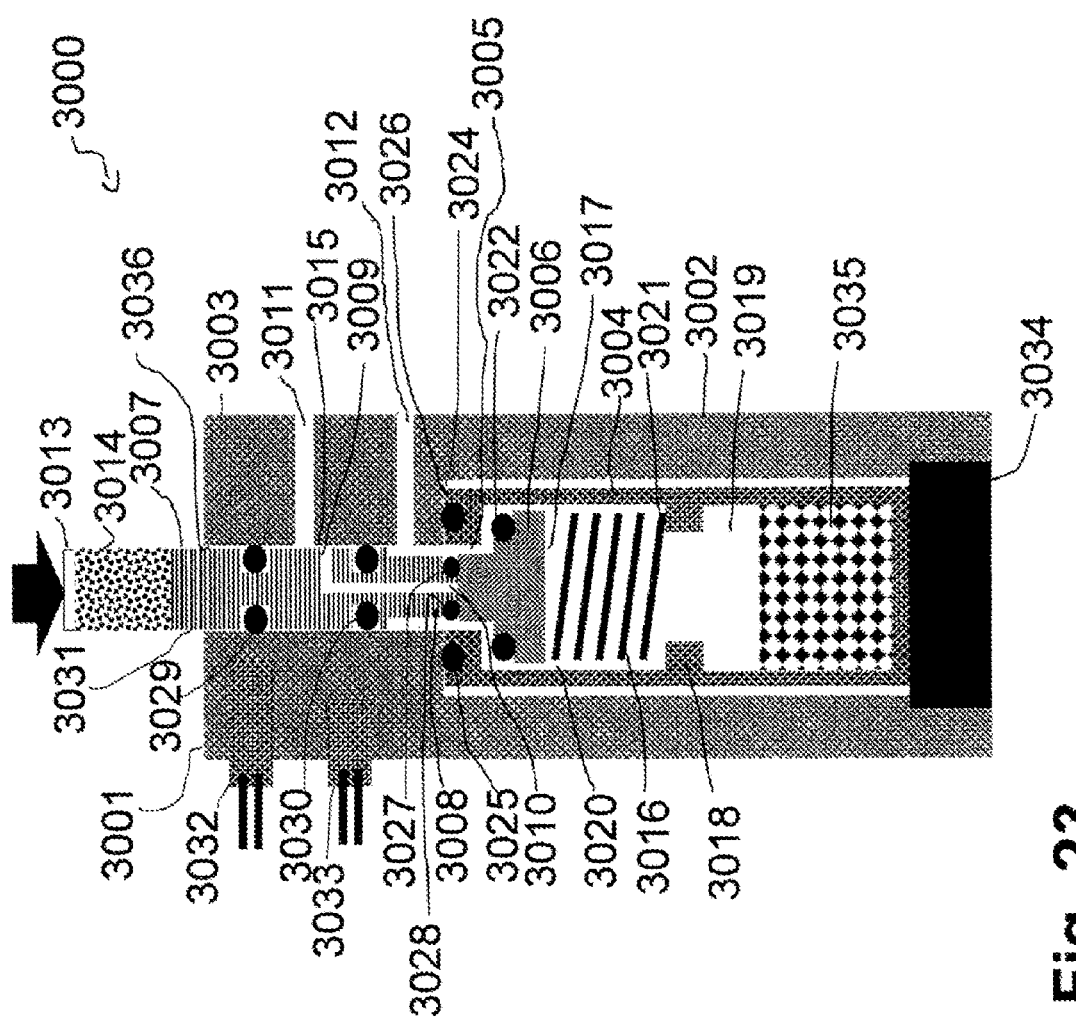
FIG. 23 shows a second schematic illustration of a gas reservoir.

In the second position of the sliding unit 3007, both the first opening 3009 of the sliding-unit line device 3008 is arranged at an inner wall 3015 of the second receiving unit 3003 and the second opening 3010 of the sliding-unit line device 3008 is arranged at the closure unit 3006. FIG. 23 shows the second position of the sliding unit 3007. FIG. 23 is based on FIG. 22. Identical components are provided with identical reference signs.

As explained above, the sliding unit 3007 is designed to be movable. More precisely, the sliding unit 3007 is designed in such a manner that, on moving into the second position, the sliding unit 3007 interacts with the closure unit 3006 such that, first, because of the contact of the sliding-unit line device 3008 with the closure unit 3006, the second opening 3010 of the sliding-unit line device 3008 is sealed, and that the first opening 3009 of the sliding-unit line device 3008 is arranged at the inner wall 3015 of the second receiving unit 3003. Furthermore, the sliding unit 3007 interacts with the closure unit 3006 in such a manner that the closure unit 3006 opens up the gas outlet opening 3005 of the gas-receiving unit 3004. In other words, the gas outlet opening 3005 is opened.

The sliding unit 3007 has a side 3027, which is directed towards the closure unit 3006, for operative connection to the closure unit 3006 and for moving the closure unit 3006. More precisely, the side 3027 is arranged at the sliding-unit line device 3008. The side 3027 of the sliding unit 3007 in turn has a sliding-unit seal 3028. The sliding-unit seal 3028 is arranged sealingly on the closure unit 3006 in the second position of the sliding unit 3007.

In the first position of the sliding unit 3007, the movable closure unit 3006 closes the gas outlet opening 3005 of the gas-receiving unit 3004. By contrast, in the second position of the sliding unit 3007, the movable closure unit 3006 is arranged spaced apart from the gas outlet opening 3005 such that the gas outlet opening 3005 is open. In other words, upon moving of the sliding unit 3007 into the second position, the sliding unit 3007 interacts with the movable closure unit 3006 in such a manner that the movable closure unit 3006 is arranged spaced apart from the gas outlet opening 3005 such that the gas outlet opening 3005 is open.

The movable closure unit 3006 is pretensioned in the direction of the second receiving unit 3003 of the basic body 3001. A spring unit 3016 is provided which is arranged between a side 3017 of the closure unit 3006 directed towards an interior 3019 of the gas-receiving unit 3004 and a protrusion 3018 in the interior 3019. The spring unit 3016 has a first end 3020, which is arranged at the side 3017, and a second end 3021, which is arranged at the protrusion 3018. If the sliding unit 3007 is brought from the second position back into the first position again, the movable closure unit 3006 is moved owing to the pretensioning provided by the spring unit 3016 in such a manner that the gas outlet opening 3005 of the gas-receiving unit 3004 is closed by the movable closure unit 3006, and therefore gas can no longer emerge out of the gas outlet opening 3005.

The movable closure unit 3006 has a closure unit seal 3022 on a side of the movable closure unit 3006 directed towards the inner wall 3023 of the gas-receiving unit 3004. In the first position of the sliding unit 3007, the closure unit seal 3022 of the movable closure unit 3006 is arranged sealingly on the inner wall 3023 of the gas-receiving unit 3004. In other words, the movable closure unit 3006 sealingly closes the gas outlet opening 3005 when the sliding unit 3007 is in the first position. No gas can then pass out of the gas-receiving unit 3004 through the gas outlet opening 3005.

The gas-receiving unit 3004 has a gas-receiving-unit seal 3025 on an outer side 3024 directed towards the first receiving unit 3002 of the basic body 3001. For example, the gas-receiving-unit seal 3025 is embodied as an O ring. Furthermore, the gas-receiving-unit seal 3025 is sealingly arranged on the inner wall 3026 of the first receiving unit 3002.

The sliding unit 3007 has a first sealing device 3029 and a second sealing device 3030. Both the first sealing device 3029 and the second sealing device 3030 are embodied as an O ring. The sliding unit 3007 has an outer side 3031 which is directed towards the inner wall 3015 of the second receiving unit 3003. Both the first sealing device 3029 and the second sealing device 3030 are arranged on the outer side 3031 of the sliding unit 3007 for sealing connection to the inner wall 3015 of the second receiving unit 3003.

At the second receiving unit 3003, a heating device 3032 is arranged in the region of the sliding unit 3007. For example, the heating device 3032 is embodied as a heating wire or a heating resistor. However, the invention is not restricted to the aforementioned embodiments. On the contrary, any heating device which is suitable for the invention can be used as the heating device 3032. Moreover, at the second receiving unit 3003, a temperature-measuring device in the form of a temperature sensor 3033 is arranged in the region of the sliding unit 3007. The temperature sensor 3033 is embodied, for example, as a semiconductor temperature sensor. However, the invention is not restricted to the use of such temperature sensors. On the contrary, any temperature sensor which is suitable for the invention can be used as the temperature sensor. The arrangement of the heating device 3032 and of the temperature sensor 3033 ensures that the sliding unit 3007, the first basic body opening 3011 and/or the second basic body opening 3012 can be somewhat warmer than the first receiving unit 3002 with the gas-receiving unit 3004. For example, the sliding unit 3007, the first basic body opening 3011 and/or the second basic body opening 3012 are/is approx. 1° C. to 3° C. warmer than the first receiving unit 3002 with the gas-receiving unit 3004. The sliding unit 3007, the first basic body opening 3011 and/or the second basic body opening 3012 being somewhat warmer than the first receiving unit 3002 with the gas-receiving unit 3004 prevents the gas from condensing outside the gas-receiving unit 3004 (for example on the sliding unit 3007 and/or on the closure unit 3006) when a gas-receiving unit 3004 is open.

The first receiving unit 3002 has a releasable closure device 3034. The releasable closure device 3034 is operatively connected to the gas-receiving unit 3004 such that the gas-receiving unit 3004 is arranged on the inner wall 3026 of the first receiving unit 3002. For example, the releasable closure device 3034 is screwable and/or insertable into the first receiving unit 3002. The releasable closure device 3034 acts on the gas-receiving unit 3004 in such a manner that the gas-receiving unit 3004 is pressed onto the inner wall 3026 of the first receiving unit 3002 such that the gas-receiving unit 3004 lies sealingly on the inner wall 3026 of the first receiving unit 3002.

The gas-receiving unit 3004 is arranged exchangeably in the first receiving unit 3002. It is therefore possible to arrange different gas-receiving units 3004, which have identical or different precursors 3035, in the first receiving unit 3002. In order to exchange the gas-receiving unit 3004, first, the closure device 3034 is released from the first receiving unit 3002. For example, the closure device 3034 is unscrewed from the first receiving unit 3002. Subsequently, a gas-receiving unit 3004 located in the first receiving unit 3002 is taken out of the first receiving unit 3002. A new gas-receiving unit 3004 which has a precursor 3035 is then inserted into the first receiving unit 3002. Subsequently, the closure device 3034 is arranged again on the first receiving unit 3002, for example by screwing into the first receiving unit 3002. The releasable closure device 3034 acts on the gas-receiving unit 3004 in such a manner that the gas-receiving unit 3004 is pressed onto the inner wall 3026 of the first receiving unit 3002 such that the gas-receiving unit 3004 lies sealingly on the inner wall 3026 of the first receiving unit 3002.

The gas reservoir 3000 ensures, on the one hand, that gas (for example the gaseous state of the precursor) can flow out of the gas-receiving unit 3004 through the second basic body opening 3012 into the line device for the feed of the gas to the object 125. On the other hand, it has been shown that the thermals within the gas reservoir 3000 are maintained and the temperature of the gas does not change or does not substantially change. If changes occur, the changes lie, for example, in the range of ±3° C. or of ±5° C. about a desired temperature. The fluctuations about a desired temperature do not or do not substantially affect the thermals within the gas reservoir 3000. The design of the gas reservoir 3000 therefore ensures that the temperature of the gas (in particular of the precursor 3035) does not change or does not substantially change when the gas reservoir 3000 is opened or closed.

The features of the invention disclosed in the present description, in the drawings and in the claims may be essential for the realization of the invention in the various embodiments thereof both individually and in arbitrary combinations. The invention is not restricted to the described embodiments. It can be varied within the scope of the claims and taking into account the knowledge of the relevant person skilled in the art.

The invention claimed is:

1. A gas reservoir for receiving a precursor, comprising:
   a basic body having a first receiving unit and a second receiving unit and having a first basic body opening that is connectable to a pump unit and a second basic body opening that is connectable to a line device to feed a gaseous state of the precursor to an object;
   a gas-receiving unit, arranged in the first receiving unit of the basic body and having a gas outlet opening and a movable closure unit that opens or closes the gas outlet opening; and
   a sliding unit, arranged movably in the second receiving unit of the basic body and having a sliding-unit line device that moves the movable closure unit and having a first opening and a second opening, wherein in a first position of the sliding unit, the first opening of the sliding-unit line device is fluidically connected to the first basic body opening and the second opening of the sliding-unit line device is fluidically connected to the second basic body opening and wherein, in a second position of the sliding unit, the first opening is arranged at an inner wall of the second receiving unit and the second opening is arranged at the movable closure unit.

2. The gas reservoir according to claim 1, wherein, in the first position of the sliding unit, the first opening of the sliding-unit line device is arranged at the first basic body opening.

3. The gas reservoir according to claim 2, wherein, in the first position of the sliding unit, the movable closure unit closes the gas outlet opening of the gas receiving unit and wherein, in the second position of the sliding unit, the movable closure unit is arranged spaced apart from the gas outlet opening such that the gas outlet opening is open.

4. The gas reservoir according to claim 3, wherein the movable closure unit is pretensioned in the direction of the second receiving unit of the basic body.

5. The gas reservoir according to claim 4, wherein the movable closure unit has a closure unit seal, and wherein in the first position of the sliding unit, the closure unit seal of the movable closure unit is arranged sealingly on an inner wall of the gas-receiving unit.

6. The gas reservoir according to claim 5, wherein the gas-receiving unit has a gas-receiving-unit seal on an outer side directed towards the first receiving unit of the basic body, and wherein the gas-receiving-unit seal is sealingly arranged on an inner wall of the first receiving unit.

7. The gas reservoir according to claim 6, wherein the sliding unit has a side, which is directed towards the movable closure unit, for operative connection to the movable closure unit and for moving the closure unit, the side of the sliding unit having a sliding-unit seal, and wherein the sliding-unit seal is arranged sealingly on the movable closure unit in the second position of the sliding unit.

8. The gas reservoir according to claim 1, wherein, in the first position of the sliding unit, the movable closure unit closes the gas outlet opening of the gas-receiving unit and wherein, in the second position of the sliding unit, the movable closure unit is arranged spaced apart from the gas outlet opening such that the gas outlet opening is open.

9. The gas reservoir according to claim 1, wherein the movable closure unit is pretensioned in the direction of the second receiving unit of the basic body.

10. The gas reservoir according to claim 1, wherein the movable closure unit has a closure unit seal, and wherein in the first position of the sliding unit, the closure unit seal of the movable closure unit is arranged sealingly on an inner wall of the gas-receiving unit.

11. The gas reservoir according to claim 1, wherein the gas-receiving unit has a gas-receiving-unit seal on an outer side directed towards the first receiving unit of the basic body, and wherein the gas-receiving-unit seal is sealingly arranged on an inner wall of the first receiving unit.

12. The gas reservoir according to claim 1, wherein the sliding unit has a side, which is directed towards the movable closure unit, for operative connection to the movable closure unit and for moving the closure unit, the side of the sliding unit having a sliding-unit seal, and wherein the sliding-unit seal is arranged sealingly on the movable closure unit in the second position of the sliding unit.

13. The gas reservoir according to claim 1, wherein the sliding unit has at least one sealing device, the sliding unit having an outer side which is directed towards the inner wall of the second receiving unit, and wherein the sealing device is arranged on the outer side of the sliding unit to provide a sealing connection to the inner wall of the second receiving unit.

14. The gas reservoir according to claim 1, wherein at least one heating device and/or at least one temperature-measuring device is/are arranged proximal to the sliding unit.

15. The gas reservoir according to claim 1, wherein the first receiving unit has a releasable closure device, and wherein the releasable closure device is operatively connected to the gas-receiving unit such that the gas-receiving unit is arranged on the inner wall of the first receiving unit.

16. A gas feed device, comprising:
   at least one first precursor reservoir which is configured as a gas reservoir for receiving a first precursor according to claim 1;
   at least one second precursor reservoir that receives a second precursor;
   a feed unit that feeds a gaseous state of the first precursor and/or a gaseous state of the second precursor onto a surface of an object;

at least one first line device that conducts the gaseous state of the first precursor to the feed unit, the first line device being arranged between the first precursor reservoir and the feed unit;

at least one second line device that conducts the gaseous state of the second precursor to the feed unit, the second line device being arranged between the second precursor reservoir and the feed unit;

at least one first valve that controls the inflow of the gaseous state of the first precursor, the first valve being arranged between the first line device and the feed unit;

at least one second valve that controls the inflow of the gaseous state of the second precursor, the second valve being arranged between the second line device and the feed unit;

at least one third valve that controls the inflow of the gaseous state of the first precursor, the third valve being arranged between the first line device and the first precursor reservoir;

at least one fourth valve that controls the inflow of the gaseous state of the second precursor, the fourth valve being arranged between the second line device and the second precursor reservoir; and at least one control valve, connected to the first valve by a third line device and to the second valve by a fourth line device, the control valve being arranged between the first valve and the feed unit and between the second valve and the feed unit, the control valve controlling the inflow of the gaseous state of the first precursor and/or the gaseous state of the second precursor to the feed unit, wherein the control valve is connected to the feed unit to feed the gaseous state of the first precursor and/or the gaseous state of the second precursor onto the surface of the object.

17. The gas feed device according to claim 16, wherein the second precursor reservoir is configured as a gas reservoir according to claim 1.

18. A particle beam apparatus for imaging, analyzing and/or processing an object, comprising
- at least one beam generator that generates a particle beam with charged particles;
- at least one objective lens that focuses the particle beam onto the object;
- at least one sample chamber that arranges the object in the particle beam apparatus;
- at least one detector that detects interaction particles and/or interaction radiation arising during an interaction of the particle beam with the object; and
- at least one gas reservoir according to claim 1 or at least one gas feed device according to claim 16.

19. The particle beam apparatus according to claim 18, wherein the beam generator is embodied as a first beam generator, wherein the particle beam is embodied as a first particle beam that includes first charged particles, wherein the objective lens is embodied as a first objective lens for focusing the first particle beam onto the object, and wherein the particle beam apparatus (200) further comprises:
- at least one second beam generator that generates a second particle beam with second charged particles; and
- at least one second objective lens that focuses the second particle beam onto the object.

20. The particle beam apparatus according to claim 18, wherein the particle beam apparatus is an electron beam apparatus and/or an ion beam apparatus.

* * * * *